(12) United States Patent
Shimomura et al.

(10) Patent No.: US 7,713,441 B2
(45) Date of Patent: May 11, 2010

(54) FLUORESCENT MATERIAL, FLUORESCENT DEVICE USING THE SAME, AND IMAGE DISPLAY DEVICE AND LIGHTING EQUIPMENT

(75) Inventors: Yasuo Shimomura, Yokohama (JP); Naoto Kijima, Yokohama (JP); Tomoyuki Kurushima, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 441 days.

(21) Appl. No.: 11/577,016

(22) PCT Filed: Oct. 14, 2005

(86) PCT No.: PCT/JP2005/018981

§ 371 (c)(1),
(2), (4) Date: Apr. 11, 2007

(87) PCT Pub. No.: WO2006/041168

PCT Pub. Date: Apr. 20, 2006

(65) Prior Publication Data

US 2007/0257596 A1     Nov. 8, 2007

(30) Foreign Application Priority Data

Oct. 15, 2004 (JP) ............................. 2004-030752
Feb. 7, 2005 (JP) ............................. 2005-030677
Apr. 18, 2005 (JP) ............................. 2005-119986

(51) Int. Cl.
C09K 11/59 (2006.01)
C09K 11/55 (2006.01)
C09K 11/79 (2006.01)
C09K 11/64 (2006.01)

(52) U.S. Cl. ........................... 252/301.4 F; 252/301.4 R

(58) Field of Classification Search ........... 252/301.4 F, 252/301.4 R; 313/503, 483, 486; 257/98
See application file for complete search history.

(56) References Cited

U.S. PATENT DOCUMENTS 7,094,362 B2 * 8/2006 Setlur et al. ........... 252/301.4 F (Continued)

FOREIGN PATENT DOCUMENTS

CN     1397828 A     2/2003

(Continued)

OTHER PUBLICATIONS

Yasuo Shimomura, et al., "Luminescent Properties of Green Phosphor Ca3Sc2Si3O12: Ce", Proceedings of the 65th Annual Meeting for the Japan Society of Applied Physics, No. 3, 2004.

(Continued)

*Primary Examiner*—C. Melissa Koslow
(74) *Attorney, Agent, or Firm*—Oblon, Spivak, McClelland, Maier & Neustadt, L.L.P.

(57) ABSTRACT

To present a green- to yellow-emitting phosphor whereby a light-emitting device having high color rendering properties and high luminance can be obtained, a light-emitting device employing such a phosphor, and an image display device and a lighting system, containing such a light-emitting device.

A phosphor made of a compound represented by the following formula (I), which comprises, as matrix, a compound of a garnet structure and which contains, as a luminescent center ion, a metal element in the matrix:

$$M^1_a M^2_b X_c M^3_d M^4_3 O_e \quad (I)$$

wherein $M^1$ is Mg and/or Zn, $M^2$ is a bivalent metal element excluding Mg and Zn, X is a metal element as a luminescent center ion composed mainly of Ce, $M^3$ is a trivalent metal element excluding X, $M^4$ is a tetravalent metal element, and a, b, c, d and e are numbers satisfying the following formulae, respectively:

$0.001 \leq a \leq 0.5$ $2.5 \leq b \leq 3.3$ $0.005 \leq c \leq 0.5$ $1.5 \leq d \leq 2.3$ $e = \{(a+b) \times 2 + (c+d) \times 3 + 12\}/2.$

10 Claims, 22 Drawing Sheets

U.S. PATENT DOCUMENTS

| | | | |
|---|---|---|---|
| 7,189,340 B2 * | 3/2007 | Shimomura et al. ... | 252/301.4 F |
| 2004/0090180 A1 | 5/2004 | Shimizu et al. | |
| 2005/0093442 A1 | 5/2005 | Setlur et al. | |
| 2005/0156496 A1 | 7/2005 | Takashima et al. | |

FOREIGN PATENT DOCUMENTS

| | | | |
|---|---|---|---|
| EP | 1 742 096 A1 | | 1/2007 |
| JP | 2003 027057 | | 1/2003 |
| JP | 2003-64358 | * | 3/2003 |
| JP | 2004 143408 | | 5/2004 |
| JP | 2005 243699 | | 9/2005 |

OTHER PUBLICATIONS

Yasuo Shimomura, et al., "Local Structure of Green Emitting Ca3Sc2Si3O12: Ce3+ Phosphor for White LED", Proceedings of the $52^{nd}$ Meeting for the Japan Society of Applied Physics and Related Societies, No. 3, 2005.

Yasuo Shimomura, et al., "Photoluminescence and Crystal Structure of Ca3Sc2Si3O12: Ce3+, Green Phosphor for White LED", The Rare Earth Society of Japan, No. 46, pp. 116-117, 2005.

U.S. Appl. No. 11/909,009, filed Sep. 18, 2007, Kijima, et al.

Anant A. Setlur, et al. "Crystal Chemistry and Luminescence of $Ce^{3+}$-Doped $Lu_2CaMg_2(Si, Ge)_3O_{12}$ and its Use in LED Based Lighting", Chem. Mater., vol. 18, No. 14, 2006, pp. 3314-3322.

* cited by examiner

FLUORESCENT MATERIAL, FLUORESCENT DEVICE USING THE SAME, AND IMAGE DISPLAY DEVICE AND LIGHTING EQUIPMENT

TECHNICAL FIELD

The present invention relates to a phosphor wherein the matrix compound contains a metal element composed mainly of cerium (Ce) as a luminescent center ion, and a light-emitting device employing it. Particularly, it relates to a phosphor which absorbs light in a range of from ultraviolet light to visible light and emits a visible light with a longer wavelength and whereby in combination with a light source such as a light emitting diode (LED) or a laser diode (LD), a light-emitting device having high color rendering properties and high luminance can be obtained, and a light-emitting device employing such a phosphor. Further, it relates to an image display device and a lightning system, containing such a light-emitting device.

BACKGROUND ART

A light-emitting device for emitting white color, constituted by a combination of a gallium nitride (GaN)-type blue-emitting diode as a semiconductor light-emitting element and a phosphor as a wavelength-conversion material, has a long useful life with small power consumption and thus has attracted an attention as a light-emitting source for an image display device or a lighting system.

With such a light-emitting device, the phosphor used therein absorbs visible light in a blue color region emitted from the GaN-type blue-emitting diode and emits yellow light, whereby white color emission is obtainable by the color mixing of the yellow light with the blue light of the light-emitting diode not absorbed by the phosphor. As such a phosphor, typically, a phosphor is known which comprises, as matrix, an yttrium/aluminum composite oxide ($Y_3Al_5O_{12}$) and which contains cerium (Ce) as a luminescent center ion in the matrix. However, this phosphor is difficult to prepare, for example, as the is firing temperature is high, and it was not satisfactory also from the viewpoint of the temperature quenching.

As a substitute yellow phosphor, the present inventors have invented a phosphor having a basic structure being $Ca_3Sc_2Si_3O_{12}:Ce^{3+}$ (hereinafter referred to simply as "CSS phosphor") and previously filed a patent application (Patent Document 1). Namely, it is a phosphor which comprises, as matrix, a compound of a garnet crystal structure represented by the following formula and which contains a luminescent center ion in the matrix.

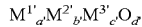

wherein $M^{1'}$ is a bivalent metal element, $M^{2'}$ is a trivalent metal element, $M^{3'}$ is a tetravalent metal element, a' is a number within a range of from 2.7 to 3.3, b' is a number within a range of from 1.8 to 2.2, c' is a number within a range of from 2.7 to 3.3, and d' is a number within a range of from 11.0 to 13.0.

The Patent Document 1 discloses Ca as the bivalent metal element $M^{1'}$ and also discloses a phosphor wherein a part of Ca is substituted by e.g. Mg or Zn. Such CSS phosphor is one which emits from blue- to yellow-color depending upon the composition and is a high performance phosphor which can be used also as a green phosphor for a light-emitting device having a GaN-type blue-emitting diode, a green phosphor and a red phosphor combined.

Patent Document 1: JP-A-2003-64358

DISCLOSURE OF THE INVENTION

Problems to be Solved by the Invention

By a study made by the present inventors, it has been found that the phosphor disclosed in the Patent Document 1 is not satisfactory with respect to the luminance and color rendering properties, as described in the following (a) to (c), when it is used in combination with a GaN-type blue emitting diode for a light-emitting device.

(a) The emission spectrum of the CSS phosphor does not agree with the spectral luminous efficiency curve for the CIE standard photometric observer (see "Phosphor Handbook", published by Ohm K. K., p. 422), and thus, the CSS phosphor has a problem that the luminance is low relative to the luminous efficiency. (b) In a case where a light-emitting device containing the CSS phosphor is used for a back light of a liquid crystal display, the emission peak wavelength of the CSS phosphor does not agree with the wavelength region where the transmittance of a green color of a conventional liquid crystal display color filter is high, whereby the luminance as a liquid crystal display tends to be low. Further, (c) in a case where a light-emitting device containing the CSS phosphor is used for lighting, the proportion of bluish green light (510 nm or lower) having low visibility in the total emission is large, whereby the energy efficiency tends to be low, and also the color rendering properties will not be fully satisfactory.

The present invention has been made in view of the above problems, and it is an object of the present invention to provide a phosphor which emits from green- to yellow-color and has high luminance and color rendering properties and whereby a light-emitting device having a high luminance can be obtained, a light-emitting device employing such a phosphor, and an image display device and a lighting system containing such a light-emitting device.

Means to Solve the Problems

As a result of an extensive study to solve the above problems, the present inventors have found it possible to change the shape of the emission spectrum and the peak wavelength by limiting the matrix composition of the above-mentioned CSS phosphor to a specific range, and have arrived at the present invention.

Namely, the present invention provides the following:

(1) A phosphor made of a compound represented by the following formula (I), which comprises, as matrix, a compound of a garnet structure and which contains, as a luminescent center ion, a metal element in the matrix:

$$M^1_a M^2_b X_c M^3_d M^4_3 O_e \quad (I)$$

wherein $M^1$ is Mg and/or Zn, $M^2$ is a bivalent metal element excluding Mg and Zn, X is a metal element as a luminescent center ion composed mainly of Ce, $M^3$ is a trivalent metal element excluding X, $M^4$ is a tetravalent metal element, and a, b, c, d and e are numbers satisfying the following formulae, respectively:

$0.001 \leq a \leq 0.5$ $2.5 \leq b \leq 3.3$ $0.005 \leq c \leq 0.5$ $1.5 \leq d \leq 2.3$ $e = \{(a+b) \times 2 + (c+d) \times 3 + 12\}/2$.

(2) The phosphor according to (1), wherein in the formula (I), $1.5 \leq d \leq 2.2$.

(3) The phosphor according to (1) or (2), wherein in the formula (I), $0.001 \leq a \leq 0.3$.

(4) The phosphor according to any one of (1) to (3), wherein in the formula (I), $0.02 \leq c \leq 0.1$.

(5) The phosphor according to any one of (1) to (4), wherein in the formula (I), $M^2$ is at least one bivalent metal element selected from the group consisting of Ca, Sr and Ba.

(6) The phosphor according to any one of (1) to (5), wherein in the formula (I), $M^3$ is at least one trivalent metal element selected from the group consisting of Al, Sc, Ga, Y, In, La, Gd and Lu.

(7) The phosphor according to any one of (1) to (6), wherein in the formula (I), $M^4$ is at least one tetravalent metal element selected from the group consisting of Si, Ti, Ge, Zr, Sn and Hf.

(8) The phosphor according to any one of (1) to (7), wherein in the formula (I), metal element X as a luminescent center ion other than Ce is at least one metal element selected from the group consisting of Mn, Fe, Pr, Nd, Sm, Eu, Gd, Tb and Tm.

(9) The phosphor according to any one of (1) to (8), wherein in the formula (I), $M^1$ is Mg.

(10) The phosphor according to any one of (1) to (9), wherein in the formula (I), X is Ce.

(11) The phosphor according to any one of (1) to (4), wherein in the formula (I), X is Ce, $M^1$ is Mg, $M^2$ is Ca, $M^3$ is Sc, and $M^4$ is Si.

(12) The phosphor according to (1), wherein in the formula (I), $0.01 \leq a \leq 0.5$, and $0.05 \leq c \leq 0.5$.

(13) A phosphor made of a compound represented by the following formula (II), which comprises, as matrix, a compound of a garnet structure and which contains, as a luminescent center ion, a metal element in the matrix:

$$M^{11}{}_{a1}M^{11}{}_{b1}X^1{}_{c1}M^{31}{}_{d1}M^{41}{}_3O_{e1} \quad (II)$$

wherein $M^{11}$ is Na and/or Li, $M^{21}$ is a bivalent metal element, $X^1$ is a metal element as a luminescent center ion composed mainly of Ce, $M^{31}$ is a trivalent metal element excluding $X^1$, $M^{41}$ is a tetravalent metal element, and a1, b1, c1, d1 and e1 are numbers satisfying the following formulae, respectively:

$0.001 \leq a1 \leq 0.5$ $2.5 \leq b1 \leq 3.3$ $0.005 \leq c1 \leq 0.5$ $1.5 \leq d1 \leq 2.5$

$e1 = \{(a1+b1) \times 2 + (c1+d1) \times 3 + 12\}/2$.

(14) The phosphor according to (13), wherein in the formula (II), $0.001 \leq a1 \leq 0.3$.

(15) The phosphor according to (13) or (14), wherein in the formula (II), $0.02 \leq c1 \leq 0.1$.

(16) The phosphor according to any one of (13) or (15), wherein in the formula (II), $M^{21}$ is at least one bivalent metal element selected from the group consisting of Mg, Ca, Sr, Ba and Zn.

(17) The phosphor according to any one of (13) or (16), wherein in the formula (II), $M^{31}$ is at least one trivalent metal element selected from the group consisting of Al, Sc, Ga, Y, In, La, Gd and Lu.

(18) The phosphor according to any one of (13) or (17), wherein in the formula (II), $M^{41}$ is at least one tetravalent metal element selected from the group consisting of Si, Ti, Ge, Zr, Sn and Hf.

(19) The phosphor according to any one of (13) or (18), wherein in the formula (II), metal element $X^1$ as a luminescent center ion other than Ce is at least one metal element selected from the group consisting of Mn, Fe, Pr, Nd, Sm, Eu, Gd, Tb and Tm.

(20) The phosphor according to any one of (13) or (19), wherein in the formula (II), $M^{11}$ is Na.

(21) The phosphor according to any one of (13) or (20), wherein in the formula (II), $X^1$ is Ce.

(22) The phosphor according to (13), wherein in the formula (II), $X^1$ is Ce, $M^{11}$ is Na, $M^{21}$ is Ca, $M^{31}$ is Sc, and $M^{41}$ is Si.

(23) An oxide phosphor having a single crystal phase and characterized in that the emission peak wavelength $\lambda$ (nm) and the half-value width $W(\frac{1}{2})$ (nm) of the emission spectrum, and/or the emission peak wavelength $\lambda$ (nm) and the spectrum width $W(\frac{1}{4})$ (nm) at $\frac{1}{4}$ of the height of the peak of the emission spectrum, satisfy the following relational formula (III) and/or (IV):

$$W(\tfrac{1}{2}) \geq \lambda/4 - 18 \quad (III)$$

where $\lambda$ is a number satisfying the following formula:

$520 \leq \lambda \leq 600$ $$W(\tfrac{1}{4}) \geq \lambda/2 - 100 \quad (IV)$$

Where $\lambda$ is a number satisfying the following formula:

$520 \leq \lambda \leq 600$.

(24) The phosphor according to any one of (1) to (22), wherein the median diameter of the phosphor is from 5 μm to 30 μm.

(25) A light-emitting device comprising a light source to emit light within a range of from ultraviolet light to visible light and at least one phosphor to convert the wavelength of at least a part of the light from the light source thereby to emit light with a wavelength longer than the light from the light source, wherein the phosphor contains the phosphor as defined in any one of (1) to (24).

(26) The light-emitting device according to (25), which emits white light.

(27) An image display device comprising the light-emitting device as defined in (25) or (26).

(28) A lighting system comprising a light-emitting device as defined in (25) or (26).

EFFECTS OF THE INVENTION

According to the present invention, it is possible to provide a phosphor which emits from green to yellow color and has high luminance and color rendering properties and whereby a light-emitting device with high luminance can be obtained. Further, by using the phosphor of the present invention, it is possible to provide a light-emitting device, image display device and lighting system, having high color rendering properties and high luminance.

MEANINGS OF SYMBOLS

Figure 1:
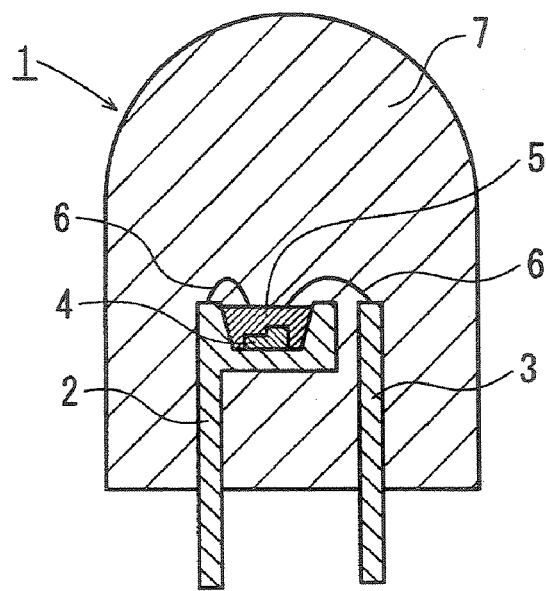
FIG. 1 is a diagrammatical cross-sectional view illustrating an embodiment of a light-emitting device constituted by a light source and a phosphor of the present invention as a wavelength-conversion material.

1: Light-emitting device
2: Mount lead
3: Inner lead
4: Light source
5: Phosphor-containing resin portion
6: Conductive wire
7: Molded component
8: Surface-emitting lighting system
9: Diffuser panel
10: Casing
11: LED
12: Phosphor-containing resin portion
13: Frame
14: Conductive wire
15: Terminal
16: Terminal

BEST MODE FOR CARRYING OUT THE INVENTION

Now, the present invention will be described in detail with reference to practical embodiments. However, it should be understood that the present invention is by no means restricted to such specific embodiments. In this specification, the numerical range represented by means of "-" or "to" means the range containing the numerical values given before and after "-" or "to" as the lower and upper limit values. Further, in this specification, the relations between colors and color coordinates are all based on JIS standards (JIS Z8110).

Now, the phosphor represented by the formula (I) will be described.

The phosphor of the present invention is characterized in that it is made of a compound represented by the following formula (I), which comprises, as matrix, a compound of a garnet structure and which contains, as a luminescent center ion, a metal element in the matrix:

$$M^1_a M^2_b X_c M^3_d M^4_3 O_e \qquad (I)$$

wherein $M^1$ is Mg and/or Zn, $M^2$ is a bivalent metal element excluding Mg and Zn, X is a metal element as a luminescent center ion composed mainly of Ce, $M^3$ is a trivalent metal element excluding X, $M^4$ is a tetravalent metal element, and a, b, c, d and e are numbers satisfying the following formulae, respectively:

$0.01 \leq a \leq 0.5$ $2.5 \leq b \leq 3.3$ $0.005 \leq c \leq 0.5$ $1.5 \leq d \leq 2.3$ $e = \{(a+b) \times 2 + (c+d) \times 3 + 12\}/2$.

Here, in the above formula (I), $M^1$ representing Mg and/or Zn, is preferably such that Mg occupies at least 50 mol %, particularly preferably 100 mol %, of $M^1$.

In the above formula (I), $M^2$ representing a bivalent metal element excluding Mg and Zn, is preferably at least one member selected from the group consisting of Ca, Sr and Ba. Further, it is preferably such that Ca occupies at least 50 mol %, particularly preferably 100 mol %, of $M^2$.

In the above formula (I), $M^3$ representing a trivalent metal element excluding metal element X as a luminescent center ion, is preferably at least one member selected from the group consisting of Al, Sc, Ga, Y, In, La, Gd and Lu, more preferably at least one member selected from the group consisting of Al, Sc, Y and Lu. Further, it is preferably such that Sc occupies at least 50 mol % of $M^3$, with the rest being Y or Lu, particularly preferably such that Sc occupies 100 mol % of $M^3$.

In the above formula (I), $M^4$ representing a tetravalent metal element, is preferably at least one member selected from the group consisting of Si, Ti, Ge, Zr, Sn and Hf, more preferably at least one member selected from the group consisting of Si, Ge and Sn. Further, it is preferably such that Si occupies at least 50 mol %, particularly preferably 100 mol %, of $M^4$.

In the above formula (I), X representing a metal element as a luminescent center ion composed mainly of Ce, is preferably such that Ce occupies at least 50 mol %, more preferably at least 70 mol %, still more preferably at least 90 mol %, particularly preferably 100 mol %, of X.

Upon absorption of visible lights within a wavelength region of from 400 nm to 500 nm, $Ce^{3+}$ ions will emit green, yellowish green, yellow and orange color lights, but, with the phosphor of the present invention, the emission color can be adjusted to be a desired color by adjusting both the amount of Ce to be incorporated and the amount of $M^1$ ions to be incorporated.

The metal element as a luminescent center ion other than Ce may, for example, be one or more members from Mn, Fe, Pr, Nd, Sm, Eu, Gd, Tb and Tm. For example, when Pr is contained, emission derived from $Pr^{3+}$ ions will appear in the vicinity of 620 nm together with the emission derived from $Ce^{3+}$ ions, whereby the red color component increases, and the emission color of the phosphor can be adjusted to the red color side, and the color rendering properties can be increased.

The above-mentioned game structure is a body-centered cubic crystal structure represented by the formula $X_3B_2C_3O_{12}$ (wherein A is a bivalent metal element, B is a trivalent metal element, and C is a tetravalent metal element) and represented by a space group symbol Ia3d. A, B and C ions are, respectively, positioned at dodeca-, octa- and tetrahedron coordination sites and respectively have 8, 6 and 4 oxygen atoms coordinated. Thus, it is the same structure as the crystal structure which natural mineral garnet has. In the phosphor represented by the above formula (I), the bivalent metal element $M^2$ composed mainly of Ca occupies the A ion position in the formula $A_3B_2C_3O_{12}$, the trivalent metal element $M^3$ composed mainly of Sc occupies the B ion position, and the tetravalent metal element $M^4$ composed mainly of Si occupies the C ion position, and it further contains the metal element X composed of Ce as a luminescent center ion and also contains the bivalent metal element of Mg and/or Zn.

In the above formula (I), a is required to be at least 0.001, and it is preferably at least 0.003, more preferably at least 0.01, particularly preferably at least 0.03. Further, a is required to be at most 0.5, and it is preferably at most 0.3, particularly preferably at most 0.1. If a is less than 0.001, it tends to be difficult to make the luminance high when such a phosphor is used for a light-emitting device. On the other hand, if it exceeds 0.5, the emission intensity of the phosphor substantially decreases, whereby it will be difficult to obtain a light-emitting device with high luminance.

In the above formula (I), b is from 2.5 to 3.3, preferably from 2.6 to 3.2, more preferably from 2.7 to 3.1. In the above formula $A_3B_2C_3O_{12}$, the coefficient of A ion is 3, and when it is assumed that $M^1$ of Mg or Zn in the present invention occupies the A ion position, b takes a value close to "3-a". Further, the position in the crystal which Ce as the main component of the luminescent center ion occupies, is not clearly understood, but the ionic radius of the $Ce^{3+}$ ion is extremely close to the ionic radius of a $Ca^{2+}$ ion. Accordingly, when it is assumed that Ce occupies the A ion position, b will take a value close to "3-a-c". On the other hand, it is conceivable that some of Mg or Zn as $M^1$ or the bivalent metal element as $M^2$ in the present invention are present at other than A-ion position, or inversely, some of the trivalent metal element as $M^2$ or the tetravalent metal element as $M^4$, or the monovalent metal element added as e.g. the after-mentioned flux, are present at the A ion position. Further, it is conceivable that Ce as the main component of the luminescent center ion is present at the B ion position. Taking these possibilities into consideration, b is from 2.5 to 3.3, whereby a desired phosphor can be obtained.

In the above formula (I), c is required to be at least 0.005, and it is preferably at least 0.01, more preferably at least 0.02, further preferably at least 0.03, most preferably at least 0.05. Further, c is required to be at most 0.5, and it is preferably at most 0.3, more preferably at most 0.2, particularly preferably at most 0.1. If c is less than 0.001 or more than 0.5, it will be difficult to make the luminance high when such a phosphor is used for a light-emitting device.

In the above formula (I), d is from 1.5 to 2.3, preferably from 1.5 to 2.2, particularly preferably from 1.7 to 2.0. The coefficient of the B ion in the above formula $A_3B_2C_3O_{12}$ is 2. When it is assumed that the metal element X as a luminescent center ion in the present invention occupies the B ion position, d takes a value close to "2-c". Further, like in the case of the coefficient b, taking into consideration, for example, that a metal element other than the trivalent metal element is present at the B ion position, d is from 1.5 to 2.3, whereby a desired phosphor can be obtained.

In the above formula (I), it is difficult to accurately measure e representing the coordination number of oxygen atoms. Therefore, on the assumption that the oxygen ion has an electric charge of −2, it is calculated from the respective atomic valencies of the above $M^1$, $M^2$, X, $M^3$ and $M^4$ constituting cations and the above a, b, c, d and 3 as their coefficients, so that the electric charge balance is maintained. Namely, $e=\{(a+b) \times 2 + (c+d) \times 3 + 12\}/2$.

Among the phosphors represented by the formula (I), phosphors represented by $Mg_{0.03}Ca_{2.97}Ce_{0.03}Sc_{1.97}Si_3O_{12}$, $Mg_{0.06}Ca_{2.94}Ce_{0.03}Sc_{1.94}Si_3O_{12}$, $Mg_{0.03}Ca_{2.97}Ce_{0.3}Sc_{1.97}Si_3O_{12}$, $Mg_{0.03}Ca_{2.94}Ce_{0.06}Sc_{1.97}Si_3O_{12}$, $Mg_{0.03}Ca_{2.97}Ce_{0.1}Sc_{1.97}Si_3O_{12}$, $Mg_{0.06}Ca_{2.97}Ce_{0.03}Sc_{1.94}Si_3O_{12}$,
$Mg_{0.06}Ca_{2.94}Ce_{0.06}Sc_{1.94}Si_3O_{12}$,
$Mg_{0.06}Ca_{2.9}Ce_{0.1}Sc_{1.94}Si_3O_{12}$,
$Mg_{0.1}Ca_{2.97}Ce_{0.03}Sc_{1.9}Si_3O_{12}$,
$Mg_{0.1}Ca_{2.94}Ce_{0.06}Sc_{1.9}Si_3O_{12}$ and
$Mg_{0.1}Ca_{2.9}Ce_{0.1}Sc_{1.9}Si_3O_{12}$ are, for example, preferred. Among them, particularly preferred are phosphors represented by $Mg_{0.03}Ca_{2.97}Ce_{0.03}Sc_{1.97}Si_3O_{12}$ and $Mg_{0.06}Ca_{2.94}Ce_{0.03}Sc_{1.94}Si_3O_{12}$.

The phosphor of the present invention is made of a compound containing a metal element composed mainly of Ce as a luminescent center ion in the matrix crystal of a garnet structure. However, in a case where the compositional ratio of compounds as raw materials for production are changed to some extent, there may be a case where a crystal other than the matrix compound of the garnet structure is co-existent. In such a case, such coexistence is allowable if the amount is within a range wherein the characteristics as a phosphor will not be impaired. As such a co-existent compound, for example, $Sc_2O_3$ as an unreacted raw material or by-products such as $Ca_2MgSi_2O_7$ and $Ce_{4.67}(SiO_4)_3O$ may, for example be mentioned.

The phosphor of the present invention may contain elements other than the above $M^1$ being Mg and/or Zn, the above $M^2$ being a bivalent metal element excluding Mg and Zn, the above $M^3$ being a trivalent metal element excluding Ce, the above $M^4$ being a tetravalent metal element and the metal element X composed mainly of Ce as a luminescent center ion, within a range not to impair the effects of the present invention. For example, they are elements derived from e.g. alkali halides added as crystal growth accelerators (flux) during the preparation of the phosphor. They may, for example, be alkali metal elements such as Li, Na, K, Rb and Cs, or other metal elements such as Nb, Ta, Sb and Bi, and halogen elements. However, with these metal elements and halogen elements, their ionic radius and/or electric charges are different from the ionic radius and/or electric charges of the ions to be substituted, whereby they may change the environment of Ce ions as emission ions and may change the emission wavelength and spectrum width. Accordingly, it is necessary to adjust their contents in the phosphor so that the characteristics of the phosphor will not depart from the desired ranges.

As mentioned above, the phosphor of the present invention has a garnet structure of the above formula $A_3B_2C_3O_{12}$ wherein the bivalent metal element $M^2$ composed is mainly of Ca occupies the A ion position, the trivalent metal element $M^3$ composed mainly of Sc occupies the B ion position, the tetravalent metal element $M^4$ composed mainly of Si occupies the C ion position, and it contains the metal element composed mainly of Ce as a luminescent center ion and further contains the bivalent metal element of Mg and/or Zn. Here, the bivalent ion of Mg or Zn is expected to be present at the A ion position. However, the ionic radius of Mg or Zn is closer to the ionic radius of Sc as the main component of the trivalent metal element $M^3$ occupying the B ion position rather than the ionic radius of Ca as the main component of the bivalent metal element $M^2$ occupying the A ion position. Accordingly, the majority of Mg or Zn is considered to be present at the B ion position. Further, the ionic radius of Ce as the main component of the metal element X as the luminescent center ion is closer to the ionic radius of Ca as the main component of the bivalent metal element $M^2$ occupying the A ion position than the ionic radius of Sc as the main component of the trivalent metal element $M^3$ occupying the B ion position. Accordingly, the majority of Ce is considered to be present at the A ion position. Thus, it is considered that the balance of the electric charge is maintained by the presence of Ce at the A ion position occupied by Ca as the main component of the bivalent metal element $M^2$ and the presence of Mg or Zn at the B ion position occupied by Sc as the main component of the trivalent metal element $M^3$ Namely, the excess in positive charge by the presence of trivalent Ce at the position of bivalent Ca is cancelled out by the deficiency in positive charge by the presence of bivalent Mg or Zn at the position of trivalent Sc, whereby the balance of the electric charge of the crystal as a whole is maintained.

By the study on the content of Ce in the crystal, it has been found that the content of Ce in the crystal tends to increase by an addition of Mg. This indicates that according to the above-described mechanism, Mg and Ce coexist in the crystal. Inversely, it may be said that the addition of Mg accelerates solid-solubilization of Ce at the Ca position in the crystal. And, the shift to the longer wavelength of the emission spectrum by the addition of Mg is considered to be not only derived from the change of the crystal field due to the presence of Mg as mentioned above but also attributable to the shift of the energy level of Ce ions by the interaction of Ce among themselves due to an increase of Ce contained in the crystal. Namely, the additives showing the effects of the present invention are not limited to bivalent ions such as Mg or Zn, which can be substituted at the Sc position, but monovalent ions such as Na or Li which can be substituted at the Ca position, which will be described hereinafter, or trivalent ions such as Al, Ti or B which can be substituted at the Si position, also show the same effects.

It is considered that as the phosphor of the present invention contains bivalent ions such as Mg or Zn and at the same time its content of Ce is large, the coordination environment of $Ce^{3+}$ ions as luminescent ions has been changed by a certain mechanism, so that the energy at 5d level in the excitation state of $Ce^{3+}$ ions has decreased, whereby the emission wavelength has shifted to the long wavelength side. Even if the long wavelength side shift of the emission wavelength takes place, the increase in the emission peak intensity is not so large, and if the shift width becomes large, the emission peak intensity rather tends to decrease. However, the shift to the longer wavelength of the emission wavelength will increase the overlap with the spectral luminous efficiency curve for the CIE standard photometric observer, and it is possible to substantially improve the luminance by adjusting the shift width so that the peak intensity will not decrease so much.

The process for preparation of the phosphor represented by the formula (I) is as follows.

The above phosphor of the present invention can be produced by heat-treating and reacting a pulverized mixture prepared from a compound as a source for $M^1$ being Mg and/or Zn, a compound as a source for $M^2$ being a bivalent metal element, a compound as a source for $M^3$ being a trivalent metal element and a compound as a source for $M^4$ being a tetravalent metal element as well as the respective raw material compounds as sources for metal elements X including Ce as the luminescent center ions, in the above formula (I).

Preparation of such a pulverized mixture may be carried out by various methods such as a dry method and a wet method.

(1) In a dry method, the above-mentioned compounds are pulverized by means of a dry system pulverizer such as a hammer mill, a roll mill, a ball mill or a jet mill and then mixed by means of a mixer such as a ribbon blender, a V-type blender or a Henschel mixer, or the above compounds are mixed and then pulverized by means of the dry system pulverizer.

(2) In a wet method, the above compounds are added in a medium such as water and pulverized and mixed by means of a wet system pulverizer such as a medium-stirring type pulverizer, or the above compounds are pulverized by the dry system pulverizer and then added to a medium such as water, followed by mixing to obtain a slurry, which is then dried by e.g. spray drying.

Among these preparation methods for the pulverized mixture, a wet system method employing a liquid medium is preferred particularly for a reason that with respect to the compound as a source for an element as a luminescent center ion, a small amount of such a compound is required to be uniformly mixed and dispersed entirely. Further, the wet system method is preferred also from the viewpoint that also with respect to compounds as sources for other elements, uniform mixing can be attained entirely.

In the above mixing, for the purpose of e.g. accelerating the growth of phosphor crystal or controlling the particle size, a compound containing a metal element or anion not contained in the above formula (I), i.e. a so-called a flux may be added. As such a flux, a halide of an alkali metal, an ammonium halide, various borate compounds, a halide of an alkaline earth metal, a carbonate of an alkali metal or various phosphates may, for example, be available. Specific examples of such compounds include LiF, LiCl, NaF, NaCl, KCl, KF, $NH_4F$, $NH_4Cl$, $Li_2CO_3$, $Na_2CO_3$, $Li_3PO_4$, $Na_3PO_4$, $Na_2HPO_4$, $NaHPO_4$, $K_3PO_4$, $K_2HPO_4$, $KH_2PO_4$, $H_3BO_3$, $B_2O_3$, $Na_2B_4O_7$, $MgF_2$, $CaF_2$, $SrF_2$, $BaF_2$, $MgCl_2$, $CaCl_2$, $SrCl_2$, $BaCl_2$, $AlF_3$ and $YF_3$. Among them, a fluoride, a chloride or a phosphate, is preferred from the viewpoint of the control of the particle size or the improvement in the reactivity, and particularly preferred is $CaCl_2$.

The median diameter ($D_{50}$) of the above phosphor of the present invention is usually from 2 μm to 50 μm, preferably from 5 μm to 30 μm, more preferably from 10 μm to 25 μm, most preferably from 15 μm to 20 μm. If the median diameter is too small, the efficiency for absorption of the excitation light tends to be small, whereby the luminance of the phosphor may tend to be low. On the other hand, if the median diameter is too large, the phosphor tends to sediment in a resin, whereby the LED luminance may tend to be low.

Firing is preferably carried out by means of a crucible made of alumina or quartz, a heat resistant container such as tray, or a container made of a metal such as platinum or tantalum. If required, a container coated with boron nitride may also be employed. With respect to the firing temperature, the firing may be carried out usually within a range of from 1,000° C. to 1,600° C., preferably from 1,200° C. to 1,500° C., particularly preferably from 1,400° C. to 1,500° C. The firing atmosphere is usually an atmosphere of a single gas or mixed gases, such as the atmospheric air, oxygen, carbon monoxide, carbon dioxide, nitrogen, hydrogen and argon. The heating time is from 10 minutes to 24 hours, preferably from 30 minutes to 12 hours, and if required, heating may be carried out in a plurality of times. In such a case, after heating once, pulverization, dispersion, etc. may be carried out again.

After the heat treatment of the phosphor, post-treatments such as washing, dispersing, drying and surface coating, may be carried out as the case requires. The washing treatment may be carried out by means of water, an inorganic acid such as hydrochloric acid, nitric acid or acetic acid or an alkaline aqueous solution such as aqueous ammonia or an aqueous sodium hydroxide solution. The dispersing treatment may be carried out by means of a ball mill, a jet mill or a hammer mill.

The classification treatment may be carried out by a wet system classification such as hydraulic elutriation, dry system classification by means of an air stream dispersing machine, or a combination thereof. Further, the surface coating may be carried out by a method of depositing fine particles of silica or alumina by means of their sol on the surface of phosphor particles in a wet system, or a method of depositing calcium phosphate on the surface of phosphor particles by a reaction of ammonium phosphate with a calcium compound.

Further, after such post-treatments, reheating may be carried out at a temperature lower than the above heat treatment temperature for the purpose of e.g. reducing the crystal defects of the phosphor. As the heating atmosphere at that time, it is preferred to adopt a reducing atmosphere of nitrogen, argon, nitrogen containing a small amount of hydrogen, or nitrogen containing a small amount of carbon monoxide. Further, it is more preferred to heat it in an oxidizing atmosphere such as air at a temperature of from 800° C. to 1,300° C. prior to the heating in such a reducing atmosphere.

The compound as a source for $M^1$ being Mg and/or Zn, the compound as a source for $M^2$ being a bivalent metal element, the compound as a source for $M^3$ as a trivalent metal element and the compound as a source for $M^4$ being a tetravalent metal element as well as the respective raw material compounds as sources for metal elements X including Ce as the luminescent center ions, in the above formula (I), to be used for the production of the present invention, may, for example, be oxides, hydroxides, carbonates, nitrates, sulfates, oxalates, carboxylates, halides, etc. of the respective metal elements for $M^1$, $M^2$, $M^3$ and $M^4$ as well as X. Among these, the compounds are respectively selected for use taking into consideration the reactivities for the composite oxide, the characteristics not to generate $NO_X$, $SO_X$ or the like during the firing, etc.

For $M^1$ being Mg and/or Zn, a Mg source compound may, for example, be MgO, $Mg(OH)_2$, $MgCO_3$, $Mg(OH)_2.3MgCO_3.3H_2O$, $Mg(NO_3)_2.6H_2O$, $MgSO_4$, $Mg(OCO)_2.2H_2O$, $Mg(OCOCH_3)_2.4H_2O$, $MgCl_2$ or $MgF_2$, and a Zn source compound may, for example, be ZnO, $Zn(OH)_2$, $ZnCO_3$, $Zn(NO_3)_2$, $Zn(OCO)_2$, $Zn(OCOCH_3)_2$, $ZnCl_2$ or $ZnF_2$.

With respect to Ca, Sr and Ba preferred as $M^2$ being a bivalent metal element, a Ca source compound may, for example, be CaO, $Ca(OH)_2$, $CaCO_3$, $Ca(NO_3)_2.4H_2O$, $CaSO_4.2H_2O$, $Ca(OCO)_2H_2O$, $Ca(OCOCH_3)_2H_2O$, $CaCl_2$ or $CaF_2$; a Sr source compound may, for example, be SrO, $Sr(OH)_2$, $SrCO_3$, $Sr(NO_3)_2$, $SrSO_4$, $Sr(OCO)_2.H_2O$, $Sr(OCOCH_3)_2.4H_2O$ or $SrCl_2.6H_2O$; and a Ba source compound may, for example, be BaO, $Ba(OH)_2$, $BaCO_3$, $Ba(NO_3)_2$, $BaSO_4$, $Ba(OCO)_2.2H_2O$, $Ba(OCOCH_3)_2.H_2O$ or $BaCl_2.H_2O$.

With respect to Al, Sc, Y and Lu preferred as $M^3$ being a trivalent metal element, an Al source compound may, for example, be $Al_2O_3$, $Al(OH)_3$, AlOOH, $Al(NO_3)_3.9H_2O$, $Al_2(SO_4)_3$, $AlCl_3$ or $AlF_3$; a Sc source compound may, for example be $Sc_2O_3$, $Sc(OH)_3$, $Sc_2(CO_3)_3$, $Sc(NO_3)_3$, $Sc_2(SO_4)_3$, $Sc_2(OCO)_6$ $Sc(OCOCH_3)_3$, $ScCl_3$ or $ScF_3$; a Y source compound may, for example be $Y_2O_3$, $Y(OH)_3$, $Y_2(CO_3)_3$, $Y(NO_3)_3$, $Y_2(SO_4)_3$, $Y_2(OCO)_6$, $YCl_3$ or $YF_3$; and a Lu source compound may, for example be $Lu_2O_3$, $Lu_2(SO_4)_3$, $LuCl_3$ or $LuF_3$.

With respect to Si, Ge and Sn preferred as $M^4$ being a tetravalent metal element, a Si source compound may, for example, be $SiO_2$, $H_4SiO_4$, $Si(OC_2H_5)_4$, $CH_3Si(OCH_3)_3$, $CH_3Si(OC_2H_5)_3$ or $Si(OCOCH_3)_4$; a Ge source compound may, for example, be $GeO_2$, $Ge(OH)_4$, $Ge(OCOCH_3)_4$ or $GeCl_4$; and a Sn source compound may, for example, be $SnO_2$, $SnO_2 \cdot nH_2O$, $Sn(NO_3)_4$, $Sn(OCOCH_3)_4$ or $SnCl_4$.

A Ce source compound as the main component for the metal element as a luminescent center ion may, for example, be $Ce_2O_3$, $CeO_2$, $Ce(OH)_3$, $Ce(OH)_4$, $Ce_2(CO_3)_3$, $Ce(NO_3)_3$, $Ce_2(SO_4)_3$, $Ce(SO_4)_2$, $Ce_2(OCO)_6$, $Ce(OCOCH_3)_3$, $CeCl_3$, $CeCl_4$ or $CeF_3$.

With respect to these raw material compounds, in each case, one type may be used alone or two or more types may be used in combination.

Further, among the phosphors represented by the formula (I), one satisfying $0.01 \leq a \leq 0.5$, $2.5 \leq b \leq 3.3$, $0.05 \leq c \leq 0.5$, $1.5 \leq d \leq 2.3$ and $e=\{(a+b) \times 2+(c+d) \times 3+12\}/2$, particularly one satisfying $0.1 \leq a \leq 0.3$, has an emission peak wavelength $\lambda$ (nm) of the phosphor at a certain specific position and satisfies certain specific relational formulae. Namely, it is one whereby the emission peak wavelength $\lambda$ (nm) of the phosphor is $520 \leq \lambda \leq 600$, and the peak wavelength $\lambda$ (nm) and the spectrum width at a half of the height of the peak of the emission spectrum (hereinafter sometimes referred to as "the half value width") $W(\frac{1}{2})$ (nm), and/or the emission peak wavelength $\lambda$ (nm) and the spectrum width at $\frac{1}{4}$ of the height of the peak of the emission spectrum (hereinafter sometimes referred to as "the $\frac{1}{4}$ height width") $W(\frac{1}{4})$ (nm), satisfy the following relational formula (III) and/or (IV):

$$W(\tfrac{1}{2}) \geq \lambda/4 - 18 \tag{III}$$

$$W(\tfrac{1}{4}) \geq \lambda/2 - 100 \tag{IV}$$

The peak wavelength $\lambda$ being at the specific position, and the FWHM $W(\frac{1}{2})$ and/or the $\frac{1}{4}$ height width $W(\frac{1}{4})$ being wide, are advantageous to improve the color rendering properties of a light-emitting device prepared by using such a phosphor. As a specific example, in a case where $\lambda$ is 560 nm, $W(\frac{1}{2})$ is at least 122 nm, and/or $W(\frac{1}{4})$ is at least 180 nm.

In general, if, while the same crystal structure is maintained, the composition is adjusted to change the lattice constant, etc. thereby to shift the emission peak wavelength to the long wavelength side, the emission peak width tends to be wide. A phosphor having a wide FWHM or $\frac{1}{4}$ height width exceeding such general tendency, is a phosphor advantageous for the preparation of a light-emitting device having high color rendering properties.

The range of the peak wavelength $\lambda$ of such a phosphor is at least 520 nm and at most 600 nm. If the wavelength is shorter than this range, the red component tends to be too small, and if the wavelength is longer than this range, the bluish green or green component tends to be too small. Either case is undesirable. A more preferred range of $\lambda$ is from 540 nm to 580 nm, still further preferably from 550 nm to 570 nm. By adjusting $\lambda$ within this range, it is possible to improve the color rendering properties of a light-emitting device constructed by combining the phosphor of the present invention as a wavelength-conversion material with a light source for e.g. a blue-emitting LED (light-emitting diode) or LD (laser diode).

In the present invention, the method for measuring the spectrum width W was as follows. Namely, firstly, the emission spectrum was measured by using a spectrofluorometer (F-4500, manufactured by Hitachi, Ltd.). The measuring conditions were as follows. A phosphor sample was put into a cell for a solid sample as an option of this apparatus or into a cell having an equivalent function, and the cell was set in a solid sample cell holder also as an option of the apparatus, followed by measurement.

Measuring Conditions
  Measuring mode: Fluorescence
  Excitation wavelength: Wavelength at which the emission intensity becomes highest within a range of from 200 nm to 500 nm.
  Slit width: Excitation side=5 nm, fluorescence side=5 nm
  Scanning speed: 60 nm/min or 240 nm/min
  Photomultiplier voltage: 400 V or 700 V
  Spectrum correction: Yes The obtained spectrum data were output as text data, whereupon two wavelengths at $\frac{1}{2}$ of the height of the peak were read-out, and their difference was taken as the FWHM $W(\frac{1}{2})$. Likewise, two wavelengths at $\frac{1}{4}$ of the height of the peak were read-out, and their difference was taken as the $\frac{1}{4}$ height width $W(\frac{1}{4})$.

Among the measuring conditions, most influential over the value of $W(\frac{1}{2})$ or $W(\frac{1}{4})$ is the slit width on the fluorescent side. If the slid width is made wide, on appearance, the value of $W(\frac{1}{2})$ or $W(\frac{1}{4})$ will also be large.

In the present invention, in the calculation of the value of $W(\frac{1}{2})$ or $W(\frac{1}{4})$, the F4500 model spectrofluorometer was used as mentioned above. However, $W(\frac{1}{2})$ and $W(\frac{1}{4})$ can be obtained by using other spectrum-measuring apparatus. However, the value of $W(\frac{1}{2})$ or $W(\frac{1}{4})$ may sometimes be influenced to some extent by e.g. the arrangement of the optical system of the apparatus, and accordingly, it is necessary to carry out the measurement after adjusting the measuring conditions so that the measured values will agree to the values of $W(\frac{1}{2})$ and $W(\frac{1}{4})$ shown in Examples of the present invention and Comparative Examples, or to carry out a correction by using some coefficients.

Now, the phosphor represented by the formula (II) will be described.

The phosphor of the present invention is characterized in that it is made of a compound represented by the following formula (II), which comprises, as matrix, a compound of a garnet structure and which contains, as a luminescent center ion, a metal element in the matrix:

$$M^{11}{}_{a1} M^{21}{}_{b1} X^{1}{}_{c1} M^{31}{}_{d1} M^{41}{}_{3} O_{e1} \tag{II}$$

wherein $M^{11}$ is Na and/or Li, $M^{21}$ is a bivalent metal element, $X^1$ is a metal element as a luminescent center ion composed mainly of Ce, $M^{31}$ is a trivalent metal element excluding $X^1$, $M^{41}$ is a tetravalent metal element, and a1, b1, c1, d1 and e1 are numbers satisfying the following formulae, respectively:

$$0.001 \leq a1 \leq 0.5$$

$$2.5 \leq b1 \leq 3.3$$

$$0.005 \leq c1 \leq 0.5$$

$$1.5 \leq d1 \leq 2.5$$

$$e1=\{(a1+b1) \times 2+(c1+d1) \times 3+12\}/2.$$

In the above formula (II), $M^{11}$ is Na and/or Li, but is preferably Na from such a viewpoint that the ionic radius of Na is close to the ionic radius of Ca as a particularly preferred element for the after-mentioned $M^{21}$, and its substitution at the position of $M^{21}$ can effectively be carried out.

Further, $M^{21}$ representing a bivalent metal element is preferably at least one member selected from the group consisting of Mg, Ca, Sr, Ba and Zn, particularly preferably one wherein Ca occupies at least 50 mol %, more preferably at least 95 mol %, of $M^{21}$. Further, with respect to Mg and/or Zn, the molar amount contained in the above formula (II) is preferably from 0.001 mol to 0.5 mol from the viewpoint of the after-mentioned compensation for the electric charge balance.

In the above formula (II), $M^{31}$ representing a trivalent metal element excluding the metal element $X^1$ as a luminescent center ion, is preferably at least one member selected from the group consisting of Al, Sc, Ga, Y, In, La, Gd and Lu, more preferably at least one member selected from the group consisting of Al, Sc, Y and Lu. Further, it is preferred that Sc occupies at least 50 mol % of $M^{31}$, and the rest is preferably Y and/or Lu. It is particularly preferred that Sc occupies 100 mol % of $M^{31}$.

In the above formula (II), $M^{41}$ representing a tetravalent metal element, is preferably at least one member selected from the group consisting of Si, Ti, Ge, Zr, Sn and Hf, more preferably at least one member selected from the group consisting of Si, Ge and Sn. Further, it is preferred that Si occupies at least 50 mol %, particularly preferably 100 mol %, of $M^{41}$.

In the above formula (II), $X^1$ representing a metal element as a luminescent center ion composed mainly of Ce, is preferably one wherein Ce occupies at least 50 mol %, more preferably at least 70 mol %, still more preferably at least 90%, particularly preferably 100 mol %, of $X^1$.

$Ce^{3+}$ ions will absorb visible lights within a wavelength region of from 400 nm to 500 nm and emit green, yellowish green, yellow or orange color light. With the phosphor of the present invention, the emission color can be adjusted to a desired color by adjusting both the amount of Ce added and the amount of $M^{11}$ ions added.

Further, the metal element for a luminescent center ion other than Ce may be one or more selected from e.g. Mn, Fe, Pr, Nd, Sm, Eu, Gd, Tb and Tm. For example, by incorporating Pr for a metal element as a luminescent center ion, an emission derived from $Pr^{3+}$ ions will appear in the vicinity of 620 nm together with an emission derived from $Ce^{3+}$ ions, whereby the red color component will increase, and the emission color of the phosphor can be adjusted to the red color side.

The garnet structure which the compound represented by the above formula (II) has, is a body-centered cubic crystal structure represented by the formula $A_3B_2C_3O_{12}$ (wherein A is a bivalent metal element, B is a trivalent metal element, and C is a tetravalent metal element) and represented by a space group symbol $I_{a3d}$. A, B and C ions are, respectively, positioned at dodeca-, octa- and tetra-hedron coordination sites and respectively have 8, 6 and 4 oxygen atoms coordinated, and it is the same structure as the crystal structure which natural mineral garnet has. And, in the phosphor of the present invention, preferably the bivalent metal element $M^2$ composed mainly of Ca occupies the A ion position in the above formula $A_3B_2C_3O_{12}$, the trivalent metal element $M^3$ composed mainly of Sc occupies the B ion position, the tetravalent metal element $M^4$ composed mainly of Si occupies the C ion position, and it further contains the metal element $X^1$ composed mainly of Ce as a luminescent center ion and contains a monovalent metal element of Na and/or Li.

In the above formula (II), a1 is required to be at least 0.001, and it is preferably at least 0.01, particularly preferably at least 0.03. Further, a1 is required to be at most 0.5, and it is preferably at most 0.3, particularly preferably at most 0.1. If a1 is less than 0.001, it tends to be difficult to make the luminance high when such a phosphor is used for a light-emitting device. On the other hand, if it exceeds 0.5, the emission strength tends to be low.

In the above formula (II), b1 is from 2.5 to 3.3, preferably from 2.6 to 3.2, more preferably from 2.7 to 3.1. In the above formula $A_3B_2C_3O_{12}$, the coefficient of A ion is 3, and b1 in the present invention takes a value close to "3". Further, the position in the crystal which Ce as the main component of the luminescent center ion occupies, is not clearly understood. However, the ionic radius of $Ce^{3+}$ ion is very close to the ionic radius of $Ca^{2+}$ ion, and if it is assumed that Ce occupies the A ion position, b takes a value close to "3−c". On the other hand, it is also conceivable that some of $M^{11}$ and the bivalent metal element $M^{21}$ in the present invention are present at other than the A ion position, and inversely, some of the trivalent metal element $M^{31}$ or the tetravalent metal element $M^{41}$, or monovalent metal elements added as e.g. a flux which will be described hereinafter, are present at the A ion position. Further, it is also conceivable that Ce as the main component of the luminescent center ion is present at the B ion position. Taking these possibilities into consideration, b1 is from 2.5 to 3.3, whereby a desired phosphor may be obtained.

In the above formula (II), c1 is required to be at least 0.005, and it is preferably at least 0.01, particularly preferably at least 0.03. Further, c1 is required to be at most 0.5, and it is preferably at most 0.3, particularly preferably at most 0.1. If c1 is less than 0.001 or more than 0.5, it tends to be difficult to make the luminance high when such a phosphor is used as a light-emitting device.

In the above formula (II), d1 is from 1.5 to 2.5, preferably from 1.7 to 2.4. In the above formula $A_3B_2C_3O_{12}$, the coefficient of B ion is 2, and if it is assumed that the metal element $X^1$ as the luminescent center ion in the present invention occupies the B ion position, d1 takes a value close to "2−c". Further, like in the case of the coefficient b, taking into consideration e.g. the presence of a metal element other than the trivalent metal element at the B ion position, d1 is from 1.5 to 2.5, whereby a desired phosphor may be obtained.

It is difficult to accurately measure e1 representing the number of oxygen atoms coordinated in the above formula (II). Therefore, assuming that the oxygen ion has an electric charge of −2, it is set to be $e1=\{(a1+b1)\times 2+(c1+d1)\times 3+12\}/2$, so that it can be calculated to maintain the electric balance from the respective atomic valencies of the above $M^{11}$, $M^{21}$, $X^1$, $M^{31}$ and $M^{41}$ constituting cations and the above a1, b1, c1, d1 and 3 as their coefficients.

Among the phosphors represented by the formula (II), preferred are phosphors represented by e.g.

$Ca_{2.97}Na_{0.015}Ce_{0.015}Sc_2Si_3O_{12}$,
$Ca_{2.94}Na_{0.03}Ce_{0.03}Sc_2Si_3O_{12}$,
$Ca_{2.9}Na_{0.05}Ce_{0.05}Sc_2Si_3O_{12}$,
$Ca_{2.97}Li_{0.015}Ce_{0.015}Sc_2Si_3O_{12}$,
$Ca_{2.94}Li_{0.03}Ce_{0.03}Sc_2Si_3O_{12}$ and
$Ca_{2.9}Li_{0.05}Ce_{0.05}Sc_2Si_3O_{12}$.

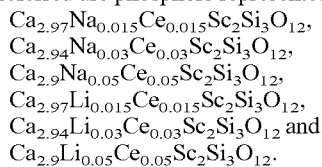

Further, the phosphor of the present invention may contain elements other than the above $M^1$ being Na and/or Li, the above $M^{21}$ being a bivalent metal element, the above $M^{31}$ being a trivalent metal element excluding Ce, the above $M^{41}$ being a tetravalent metal element and the metal element $X^1$ composed mainly of Ce as a luminescent center ion, within a range not to impair the effects of the present invention. Such elements may, for example, be alkali metal elements such as K, Rb and Cs, other metal elements such as Nb, Ta, Sb and Bi and halogen elements, derived from e.g. alkali halides added as a crystal growth accelerator (flux) during the preparation of the phosphor.

Further, the phosphor of the present invention is made of a compound containing a metal element composed mainly of Ce as a luminescent center ion in the matrix crystal of a garnet structure, but in a case where the compositional ratio of the compounds as the raw materials is changed to some extent, there may be a case where crystals other than the matrix compound of the garnet structure may coexist. In such a case, such coexistence may be allowed, if they are in an amount within a range not to impair the characteristics as the phosphor. Such coexisting compounds may, for example, be $Sc_2O_3$ as a non-reacted raw material and by-products such as $Ca_2MgSi_2O_7$ and $Ce_{4.67}(SiO_4)_3O$.

In the phosphor of the present invention, as mentioned above, preferably, the bivalent metal element $M^{21}$ composed mainly of Ca occupies the A ion position in the above formula $A_3B_2C_3O_{12}$, the trivalent metal element $M^{31}$ composed mainly of Sc occupies the B ion position, the tetravalent metal element $M^{41}$ composed mainly of Si occupies the C ion position, and it contains the metal element composed mainly of Ce as a luminescent center ion and further contains the monovalent metal element $M^1$ of Na and/or Li. Here, the monovalent metal element is expected to be present at the A ion position. Further, the ionic radius of Ce as the main component of the metal element $X^1$ as a luminescent center ion is closer to the ionic radius of Ca as the main component of the bivalent metal element $M^{21}$ occupying the A ion position than the ionic radius of Sc as the main component of the trivalent metal element $M^{31}$ occupying the B ion position. Accordingly, the majority of Ce is considered to be present at the A ion position. Thus, it is considered that the electric charge balance is maintained by the presence of both the monovalent metal element $M^{11}$ and the trivalent Ce at the A ion position occupied by Ca as the main component of the bivalent metal element $M^{21}$. Namely, the excess in the positive charge caused by the presence of trivalent Ce at the bivalent Ca position is canceled out with the deficiency in the positive electric charge by the presence of monovalent Na and/or Li at the same bivalent Ca position, whereby the electric charge balance as the entire crystal is maintained. Here, the contents in the phosphor of the monovalent metal element $M^{11}$ and the luminescent center ion metal element composed mainly of trivalent Ce do not necessarily agree, and the electric charge balance in such a case is considered to be compensated by various lattice defects.

The excess in the positive electric charge caused by substitution of Ce at the A ion position occupied mainly by bivalent Ca may be compensated not only by the presence of Na or Li at the same Ca position but also by the presence of Mg and/or Zn as the bivalent metal element $M^2$ at the B ion position occupied mainly by trivalent Sc. The ionic radius of Mg or Zn is closer to the ionic radius of Sc as the main component of the trivalent metal element $M^{31}$ occupying at the B ion position than the ionic radius of Ca as the main component of the bivalent metal element occupying the A ion position, and accordingly, it is considered to be is highly likely that the majority of Mg or Zn is present at the B ion position. As mentioned above, it is possible to let Mg and/or Zn as the bivalent metal element $M^2$ coexist in the phosphor of the present invention, and in such a case, the electric charge balance is considered to be compensated by all elements substituted at positions having different valencies.

And, as the phosphor of the present invention contains a monovalent ion of Na or Li and at the same time, the content of Ce as a luminescent ion is increased or, further if necessary, a bivalent ion of Mg or Zn is incorporated, the coordination state around $Ce^{3+}$ ion as the main component of the luminescent center ion changes. And, it is considered that the emission wavelength has shifted to the long wavelength side by a decrease of the energy at 5d level being an excitation state of $Ce^{3+}$ ion. Even if the long wavelength side shift of the emission wavelength takes place, the increase in the emission peak intensity is not so large, and if the shift width becomes large, inversely, a decrease in the emission peak intensity takes place. However, the long wavelength side shift of the emission wavelength increases the overlap with the spectral luminous efficiency curve for the CIE standard photometric observer, whereby it is possible to substantially improve the luminance by adjusting the shift width to a level where the peak intensity will not decrease so much.

The method for producing the phosphor represented by the formula (II) is as follows.

The above phosphor of the present invention can be produced by heat-treating and reacting a pulverized mixture prepared from a compound as a source for $M^{11}$ being Na and/or Li, a compound as a source for $M^{21}$ being a bivalent metal element, a compound as a source for $M^{31}$ being a trivalent metal element and a compound as a source for $M^{41}$ being a tetravalent metal element as well as the respective raw material compounds as sources for metal elements $X^1$ including Ce as the luminescent center ions, in the above formula (II).

Preparation of such a pulverized mixture may be carried out by various methods such as a dry method and a wet method.

(1) In a dry method, the above-mentioned compounds are pulverized by means of a dry system pulverizer such as a hammer mill, a roll mill, a ball mill or a jet mill and then mixed by means of a mixer such as a ribbon blender, a V-type blender or a Henschel mixer, or the above compounds are mixed and then pulverized by means of the dry system pulverizer.

(2) In a wet method, the above compounds are added in a medium such as water and pulverized and mixed by means of a wet system pulverizer such as a medium-stirring type pulverizer, or the above compounds are pulverized by the dry system pulverizer and then added to a medium such as water, followed by mixing to obtain a slurry, which is then dried by e.g. spray drying.

Among these preparation methods for the pulverized mixture, a wet system method employing a liquid medium is preferred particularly for a reason that with respect to the compound as a source for an element as a luminescent center ion, a small amount of such a compound is required to be uniformly mixed and dispersed entirely. Further, the wet system method is preferred also from the viewpoint that also with respect to compounds as sources for other elements, uniform mixing can be attained entirely.

Here, in the above mixing, for the purpose of e.g. accelerating the growth of phosphor crystal or controlling the particle size, a compound containing a metal element or anion not contained in the above formula (II), i.e. a so-called a flux may be added. As such a flux, a halide of an alkali metal, an ammonium halide, various borate compounds, a halide of an alkaline earth metal, a carbide of an alkali metal or various phosphates may, for example, be mentioned. Specific examples of such compounds include LiF, LiCl, NaF, NaCl, KCl, KF, $NH_4F$, $NH_4Cl$, $Li_2CO_3$, $Na_2CO_3$, $Li_3PO_4$, $Na_3PO_4$, $Na_2HPO_4$, $NaHPO_4$, $K_3PO_4$, $K_2HPO_4$, $KH_2PO_4$, $H_3BO_3$, $B_2O_3$, $Na_2B_4O_7$, $MgF_2$, $CaF_2$, $SrF_2$, $BaF_2$, $MgCl_2$, $CaCl_2$, $SrCl_2$, $BaCl_2$, $AlF_3$ and $YF_3$. Among them, a fluoride, a chloride or a phosphate, is preferred from the viewpoint of the control of the particle size or the improvement in the reactivity, and particularly preferred is $CaCl_2$.

The median diameter ($D_{50}$) of the above phosphor of the present invention is usually from 2 μm to 50 μm, preferably from 5 μm to 30 μm, more preferably from 10 μm to 25 μm, most preferably from 15 μm to 20 μm. If the median diameter is too small, the efficiency for absorption of the excitation light tends to be small, whereby the luminance of the phosphor may tend to be low. On the other hand, if the median diameter is too large, the phosphor tends to sediment in a resin, whereby the LED luminance may tend to be low.

Firing is preferably carried out by means of a heat resistant container such as crucible or tray made of alumina or quartz, or a container made of a metal such as platinum or tantalum. If required, a container coated with boron nitride may also be employed. With respect to the firing temperature, the firing may be carried out usually within a range of from 1,000° C. to 1,600° C., preferably from 1,200° C. to 1,500° C., particularly preferably from 1,400° C. to 1,500° C. The firing atmosphere is usually an atmosphere of a single gas or mixed gases, such as the atmospheric air, oxygen, carbon monoxide, carbon dioxide, nitrogen, hydrogen and argon. The heating time is from 10 minutes to 24 hours, preferably from 30 minutes to 12 hours, and if required, heating may be carried out in a plurality of times. In such a case, after heating once, pulverization, dispersion, etc. may be carried out again.

After the heat treatment of the phosphor, post-treatments such as washing, dispersing, drying and surface coating, may be carried out as the case requires. The washing treatment may be carried out by means of water, an inorganic acid such as hydrochloric acid, nitric acid or acetic acid or an alkaline aqueous solution such as aqueous ammonia or an aqueous sodium hydroxide solution. The dispersing treatment may be carried out by means of a ball mill, a jet mill or a hammer mill. The classification treatment may be carried out by a wet system classification such as hydraulic elutriation, dry system classification by means of an air stream dispersing machine, or a combination thereof. Further, the surface coating may be carried out by a method of depositing fine particles of silica or alumina by means of their sol on the surface of phosphor particles in a wet system, or a method of depositing calcium phosphate on the surface of phosphor particles by a reaction of ammonium phosphate with a calcium compound.

Further, after such post-treatments, reheating may be carried out at a temperature lower than the above heat treatment temperature for the purpose of e.g. reducing the crystal defects of the phosphor. As the heating atmosphere at that time, it is preferred to adopt a reducing atmosphere of nitrogen, argon, nitrogen containing a small amount of hydrogen, or nitrogen containing a small amount of carbon monoxide. Further, it is more preferred to heat it in an oxidizing atmosphere such as air at a temperature of from 800° C. to 1,300° C. prior to the heating in such a reducing atmosphere.

The compound as a source for $M^{11}$ being Na and/or Li, the compound as a source for $M^{21}$ being a bivalent metal element, the compound as a source for $M^{31}$ as a trivalent metal element and the compound as a source for $M^{41}$ being a tetravalent metal element as well as the respective raw material compounds as sources for metal elements $X^1$ including Ce as the luminescent center ions, in the above formula (II), to be used for the production of the present invention, may, for example, be oxides, hydroxides, carbonates, nitrates, sulfates, oxalates, carboxylates, halides, etc. of the respective metal elements for $M^{11}$, $M^{21}$, $M^{31}$ and $M^{41}$ as well as $X^1$. Among these, the compounds are respectively selected for use taking into consideration the reactivities for the composite oxide, the characteristics not to generate $NO_X$, $SO_X$ or the like during the firing, etc.

Among the raw material compounds for $M^{11}$ being Na and/or Li, a Li source compound may, for example, be $Li_2CO_3$, $Li(NO_3)$, $LiCl$, $LiOH$, $LiCH_3COO.2H_2O$, $Li_2(C_2O_4)$, $LiF$ or $LiBr$, and a Na source compound may, for example, be $Na_2CO_3$, $Na(NO_3)$, $NaCl$, $NaOH$, $NaCH_3COO.3H_2O$, $Na_2(C_2O_4)$, $NaF$ or $NaBr$.

Among the raw material compounds for Mg, Ca, Sr, Ba and Zn preferred as $M^{21}$ being a bivalent metal element, a Mg source compound may, for example, be $MgO$, $Mg(OH)_2$, $MgCO_3$, $Mg(OH)_2.3MgCO_3.3H_2O$, $Mg(NO_3)_2.6H_2O$, $MgSO_4$, $Mg(OCO)_2.2H_2O$, $Mg(OCOCH_3)_2.4H_2O$, $MgCl_2$ or $MgF_2$, a Ca source compound may, for example, be $CaO$, $Ca(OH)_2$, $CaCO_3$, $Ca(NO_3)_2.4H_2O$, $CaSO_4.2H_2O$, $Ca(OCO)_2 \cdot H_2O$, $Ca(OCOCH_3)_2 \cdot H_2O$, $CaCl_2$ or $CaF_2$; a Sr source compound may, for example, be $SrO$, $Sr(OH)_2$, $SrCO_3$, $Sr(NO_3)_2$, $SrSO_4$, $Sr(OCO)_2.H_2O$, $Sr(OCOCH_3)_2.4H_2O$ or $SrCl_2.6H_2O$; a Ba source compound may, for example, be $BaO$, $Ba(OH)_2$, $BaCO_3$, $Ba(NO_3)_2$, $BaSO_4$, $Ba(OCO)_2.2H_2O$, $Ba(OCOCH_3)_2H_2O$ or $BaCl_2.2H_2O$; and a Zn source compound may, for example, be $ZnO$, $Zn(OH)_2$, $ZnCO_3$, $Zn(NO_3)_2$, $Zn(OCO)_2$, $Zn(OCOCH_3)_2$, $ZnCl_2$ or $ZnF_2$.

Among the raw material compounds for Al, Sc, Y and Lu preferred as $M^{31}$ being a trivalent metal element, an Al source compound may, for example be $Al_2O_3$, $Al(OH)_3$, $AlOOH$, $Al(NO_3)_3.9H_2O$, $Al_2(SO_4)_3$, $AlCl_3$ or $AlF_3$; a Sc source compound may, for example be $Sc_2O_3$, $Sc(OH)_3$, $Sc_2(CO_3)_3$, $Sc(NO_3)_3$, $Sc_2(SO_4)_3$, $Sc_2(OCO)_6$, $Sc(OCOCH_3)_3$, $ScCl_3$ or $ScF_3$; a Y source compound may, for example be $Y_2O_3$, $Y(OH)_3$, $Y_2(CO_3)_3$, $Y(NO_3)_3$, $Y_2(SO_4)_3$, $Y_2(OCO)_6$, $YCl_3$ or $YF_3$; and a Lu source compound may, for example be $Lu_2O_3$, $Lu_2(SO_4)_3$, $LuCl_3$ or $LuF_3$.

Among the raw material compounds for Si, Ge and Sn preferred as $M^{41}$ being a tetravalent metal element, a Si source compound may, for example be $SiO_2$, $H_4SiO_4$, $Si(OC_2H_5)_4$, $CH_3Si(OCH_3)_3$, $CH_3Si(OC_2H_5)_3$ or $Si(OCOCH_3)_4$; a Ge source compound may, for example be $GeO_2$, $Ge(OH)_4$, $Ge(OCOCH_3)_4$ or $GeCl_4$; and a Sn source compound may, for example be $SnO_2$, $SnO_2.nH_2O$, $Sn(NO_3)_4$, $Sn(OCOCH_3)_4$ or $SnCl_4$.

A Ce source compound as the main component for the metal element as a luminescent center ion may, for example be $Ce_2O_3$, $CeO_2$, $Ce(OH)_3$, $Ce(OH)_4$, $Ce_2(CO_3)_3$, $Ce(NO_3)_3$, $Ce_2(SO_4)_3$, $Ce(SO_4)_2$, $Ce_2(OCO)_6$, $Ce(OCOCH_3)_3$, $CeCl_3$, $CeCl_4$ or $CeF_3$.

With respect to these raw material compounds, in each case, one type may be used alone or two or more types may be used in combination.

As the phosphor in a light-emitting device of the present invention, the above-mentioned phosphors of the present invention may be used alone, or two or more of them may be used in an optional combination and in an optional ratio. In addition to the above phosphor of the present invention, a phosphor which emits light of red, orange, yellow or the like, may be used in combination, whereby the light-emitting device may be made to have higher color rendering properties. As the phosphor to be used in combination at that time, a phosphor which emits light within a wavelength region of from 580 nm to 780 nm is preferred. For example, as one using bivalent Eu as a luminescent center ion, preferred may, for example, be a sulfide phosphor such as $CaS:Eu^{2+}$ or $SrS:Eu^{2+}$, a nitride type phosphor such as $Ca_2Si_5N_8:Eu^{2+}$, $Sr_2Si_5N_8:Eu^{2+}$, $Ba_2Si_5N_8:Eu^{2+}$, $CaAlSiN_3:Eu^{2+}$, $SrAlSiN_3:Eu^{2+}$, $(Ca_{x'''},Sr_{1-x'''})AlSiN_3:Eu^{2+}$ ($0 \leq x'' \leq 1$) or $LaSi_3N_5:Eu^{2+}$, and an oxynitride type phosphor such as $Sr_2Si_3Al_2N_6O_2:Eu^{2+}$ or $Ca_{x'''}(Si_{y'''},Al_{1-y'''})_{12}(O_{z'''},N_{1-z'''})_{16}:Eu^{2+}$ ($0 \leq x'' \leq 1$, $0 \leq y'' \leq 1$, $0 \leq z'' \leq 1$). Further, as one using trivalent Eu as the luminescent center ion, preferred may, for example, be an oxysulfide type phosphor such as $La_2O_2S:Eu^{3+}$ or $Y_2O_2S:Eu^{3+}$, and a coordination compound type phosphor having acetylacetone, tenoyltrifluoroacetone or the like coordinated to trivalent Eu. Further, as one having tetravalent Mn as the luminescent center ion, preferred may, for example, be $3.5MgO.0.5MgF_2.GeO_2:Mn^{4+}$. Among them, particularly preferred is a sulfide type phosphor or a nitride type phosphor using $Eu^{2+}$ as the luminescent center ion, since the emission intensity is high. As a particularly preferred example of a red phosphor, a nitride type or oxynitride type phosphor such as $CaAlSiN_3:Eu^{2+}$, $(Sr,Ca)AlSiN_3:Eu^{2+}$, $M_2Si_5N_8:Eu^{2+}$ (wherein M is at least one member selected from the group consisting of Ca, Sr and Ba), $Sr_2Si_3Al_2N_6O_2:Eu^{2+}$ or $LaSi_3N_5:Eu^{2+}$, as disclosed in WO2005/052087A1, may, for example, be preferred.

Now, a light-emitting device, a surface emitting lighting system, etc. of the present invention will be described. The light-emitting device of the present invention is a light-emitting device comprising at least a light source and a phosphor to absorb light within a range of from ultraviolet light to visible light emitted from the light source and to emit visible light having a longer wavelength. It is a light-emitting device having high color rendering properties and being useful as a light source for an image display device such as a color liquid crystal display or for a lighting system for e.g. surface-emitting light.

Figure 2:
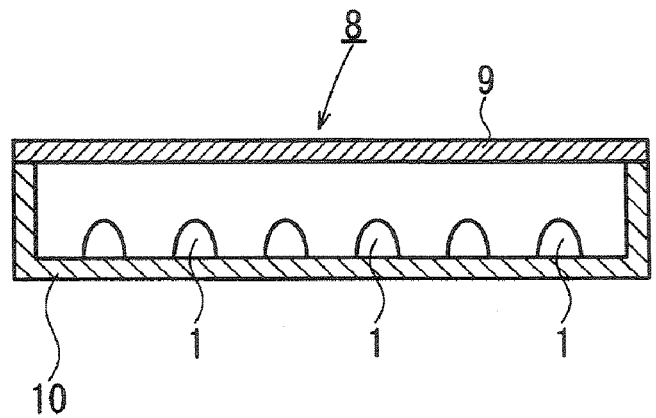
FIG. 2 is a diagrammatical cross-sectional view illustrating an embodiment of a surface emitting lighting system having incorporated the light-emitting device illustrated in FIG. 1.

The light-emitting device of the present invention will be described with reference to the drawings. FIG. 1 is a schematic cross-sectional view showing an embodiment of a light-emitting device comprising a light source and a phosphor of the present invention as a wavelength-conversion material. FIG. 2 is a schematic cross-sectional view showing an embodiment of a surface-emitting lighting system wherein the light-emitting device shown in FIG. 1 is incorporated. In FIGS. 1 and 2, reference numeral 1 indicates a light-emitting device, 2 a mount lead, 3 an inner lead, 4 a light source, 5 a phosphor-containing resin portion, 6 a conductive wire, 7 a molded component, 8 a surface-emitting lighting system, 9 a diffuser panel and 10 a casing.

The light-emitting device 1 of the present invention has, for example, a common shell form as shown in FIG. 1. A light source 4 made of e.g. a GaN type blue-emitting diode is bonded in an upper cup of a mount lead 2. The phosphor of the present invention and, if necessary, another phosphor (such as a red-emitting phosphor) are mixed and dispersed in a binder of e.g. an epoxy resin, an acrylic resin or a silicone resin and then cast into the cup to form a phosphor-containing resin portion 5. The light source 4 is covered with and secured by the phosphor-containing resin portion 5. On the other hand, the light source 4 and the mount lead 2, and the light source 4 and an inner lead 3, are electrically connected by conductive wires 6, respectively, and their entirety is covered and protected by a molded component 7 made of e.g. an epoxy resin.

Further, a surface-emitting lighting system 8 having such a light-emitting device 1 incorporated, is shown in FIG. 2. Many light-emitting devices 1 are disposed on the bottom surface of a rectangular casing 10 having the inner surface made opaque with e.g. a white smooth surface, while a light source, a circuit, etc. (not shown) to drive the light-emitting devices 1 are provided outside the light-emitting devices. To make the emission uniform, a diffuser panel 9 made of e.g. a milky white acrylic plate, is fixed at the portion corresponding to a cover of the casing 10.

And, by driving the surface-emitting lighting system 8, a voltage is applied to the light sources 4 of the light-emitting devices 1 to have blue light, etc. emitted. A part of the emission is absorbed by the phosphor of the present invention as a wavelength-conversion material and other phosphors added as the case requires and converted to light having a longer wavelength at the phosphor-containing resin portion 5, and by color mixing with the blue light, etc. not absorbed by the phosphors, an emission having high color rendering properties and high luminance can be obtained. This light is transmitted through the diffuser panel 9 and emitted upwards in the drawing, whereby illumination light having a uniform brightness will be obtained in the plane of the diffuser panel 9 of the casing 10.

The light source 4 is a light source which emits light for exciting the phosphor contained in the phosphor-containing resin portion 5 and is also a light source for emitting light as one component of light emitted by the light-emitting device 1. Namely, a part of light emitted from the light source 4 is absorbed as excitation light by the light-emitting substance in the phosphor-containing resin portion 5, and another part is emitted from the light-emitting device 1.

The type of the light source 4 is optional, and a proper type may be selected depending upon the particular application or construction of the display device. Usually, it is preferred to employ one whereby the emitted light will widely diffuse without localization in light distribution. It may, for example, be a light-emitting diode (hereinafter sometimes referred to as "LED"), an end face-emitting or surface-emitting laser diode, or an electroluminescence element. Usually, inexpensive LED is preferred. A specific example of LED may be LED employing an InGaN type, GaAlN type, InGaAlN type or ZnSeS type semiconductor crystal grown on a substrate of e.g. silicon carbide, sapphire or gallium nitride by a method such as MOCVD.

In a case where LED is employed as the light source 4, its shape is optional without any particular limitation, but in order to improve the light emitting efficiency, its side surface is preferably tapered.

Further, the material for the package of LED is also optional, and ceramics or PPA (polyphthalamide) may, for example, be optionally used. However, with a view to improving the color reproducibility, the color of the package is preferably white or silver, and with a view to increasing the luminous efficiency of the light-emitting device 1, it is preferred to have the reflectance of light increased.

Further, when the light source 4 is to be attached to the mount lead 2, the attaching method is optional, but it may, for example, be attached by means of a solder. The type of the solder is optional, but AuSn or AgSn may, for example, be employed. Further, when a solder is to be employed, it is also possible to design so that the electric power can be supplied from an electrode formed by a solder on the mount lead 2. Especially when LED or a laser diode of a large current type where heat dissipation becomes important, is employed as the light source 4, a solder exhibits excellent heat dissipation, and it is effective to use a solder to install the light source 4.

In a case where the light source 4 is to be attached to the mount lead 2 by a means other than a solder, an adhesive of e.g. an epoxy resin, an imide resin or an acrylic resin may, for example, be used. In such a case, a conductive filler such as silver particles or carbon particles may be mixed to the adhesive to obtain a paste for use, whereby, like in the case of using a solder, the adhesive may be made electrically conductive so as to supply an electric power. Further, it is preferred to mix such a conductive filler, since the heat dissipation will also be improved.

Further, the method of supplying the electric power to the light source 4 is also optional, and other than making a solder or an adhesive to be electrically conductive as mentioned above, the light source 4 and the electrode may be connected by a wire bonding to supply the electric power. In such a case, the wire to be used is not particularly limited, and its material, size, etc. are optional. For example, as the material for the wire, a metal such as gold or aluminum may be employed. Further, the thickness of the wire may be made usually from 20 µm to 40 µm, but the wire is not limited thereto.

Further, as an example for another method for supplying the electric power to the light source, a method of supplying an electric power to the light source by mounting a flip chip using a vamp, may be mentioned.

As the light source, one source may be used alone, or two or more may be used in combination. Further, the light source 4 may be of one type only, or two types or more may be used in combination.

Further, with respect to the light source 4, one light source 4 may be used for two or more phosphor-containing resin portions 5 containing different phosphors. Otherwise, two or more phosphor-containing resin portions 5 may be prepared, and a light source 4 may be provided for each of them.

Further, the light source 4 in the light-emitting device 1 is not particularly limited so long as it is one capable of emitting light within a range of from ultraviolet light to visible light. However, it is preferably one which emits light within a wavelength region of from 380 nm to 550 nm. Among them, at least 400 nm is further preferred, and at least 420 nm is particularly preferred. Further, at most 520 nm is further preferred, and at most 500 nm is particularly preferred. Among them, it is particularly preferred to employ a light source which emits light within a wavelength region of from 430 nm to 480 nm, whereby a light-emitting device having particularly high color rendering properties can be obtained.

By using the phosphor of the present invention alone for the phosphor-containing resin portion 5, it is possible to obtain a pale yellowish green, pale green or pale bluish green-emitting device. Further, by combining the phosphor of the present invention with an optional red phosphor, it is possible to constitute a white color-emitting device with a various color temperature.

For example, as phosphors to be contained in the phosphor-containing resin portion 5, the phosphor of the present invention and a red phosphor are used. The phosphor-containing resin portion 5 absorbs a part of light within a region of from ultraviolet to blue color emitted by the light source 4 and emits lights in a blue color region and a red color region. By using such a phosphor-containing resin portion 5 for the light-emitting device 1 and/or surface-emitting lighting system 8 having the above-described construction, it is possible to provide a light-emitting device 1 and/or surface-emitting lighting system 8, which emits a warm color type white light by color mixing of the blue light emitted from the light source 4 with the green light and the red light of the phosphors. The light-emitting device and/or surface-emitting lighting system is capable of emitting, for example, lights with bulb color, neutral white color and daylight white color. Here, bulb color, neutral white color and daylight white color mean emissions within the color ranges stipulated as light source colors of fluorescent lamps prescribed in JIS Z9112.

EXAMPLES

Now, the present invention will be described in further detail with reference to Examples. However, it should be understood that the present invention is by no means restricted to the following Examples.

Example 1

Together with a small amount of ethanol, raw materials comprising 0.0006 mol, as Mg, of $Mg(OH)_2 \cdot 3MgCO_3 \cdot 3H_2O$ as a $M^1$ source compound, 0.0297 mol of $CaCO_3$ as a $M^2$ source compound, 0.0097 mol of $Sc_2O_3$ as a $M^3$ source compound, 0.03 mol of $SiO_2$ as a $M^4$ source compound, and 0.003 mol of $Ce(NO_3)_3$ (aqueous solution) as an X source compound were put into an agate mortar, thoroughly mixed and then dried. Then, the dried raw material mixture was wrapped with a platinum foil and fired by heating at 1,400° C. for 3 hours under the atmospheric pressure while nitrogen gas containing 4 vol % of hydrogen was supplied. Then, pulverization and classification treatment were carried out to obtain a phosphor.

Figure 9:
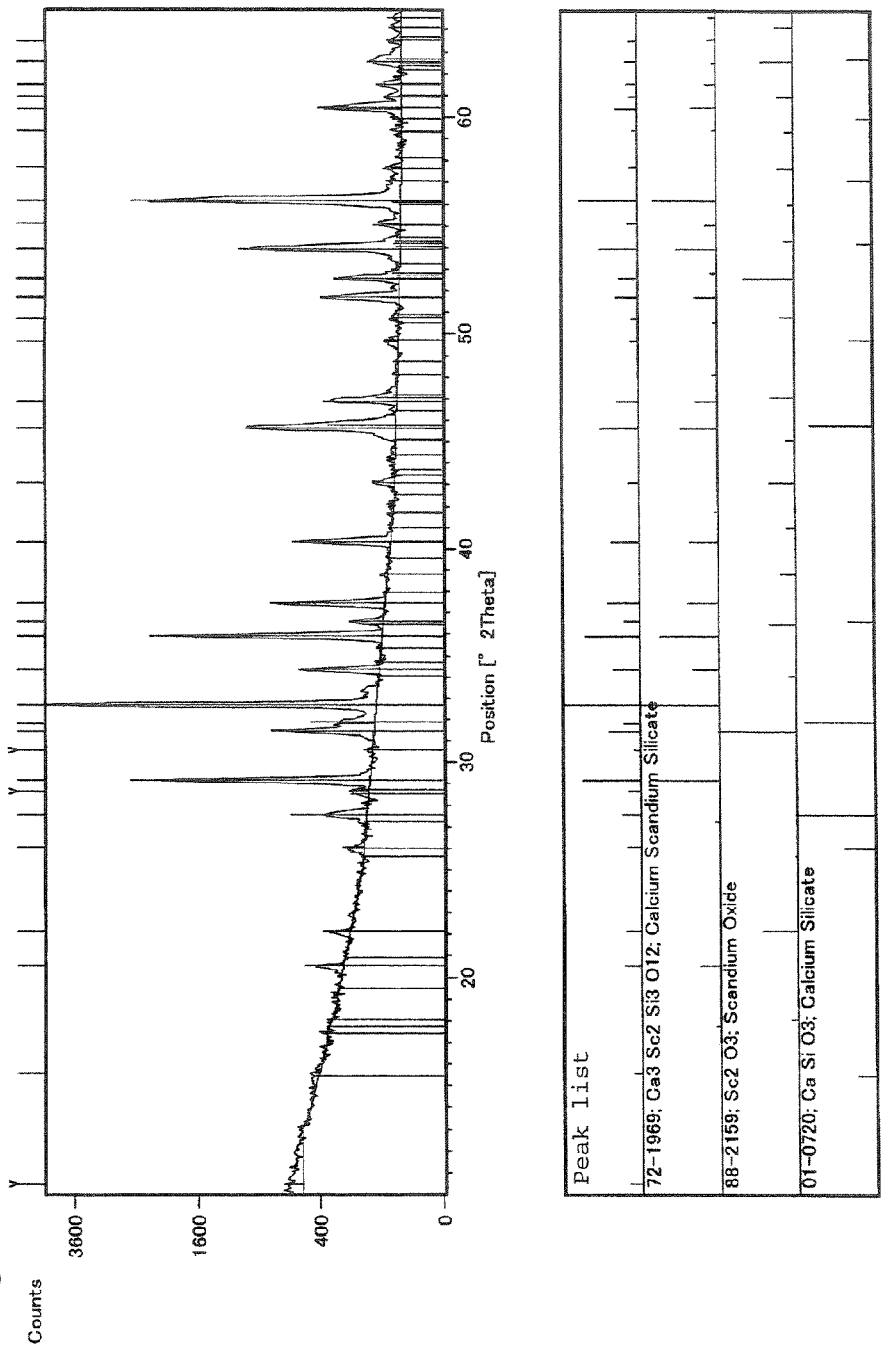
FIG. 9 is the powder X-ray diffraction pattern of the phosphor obtained in Example 1.
Figure 10:
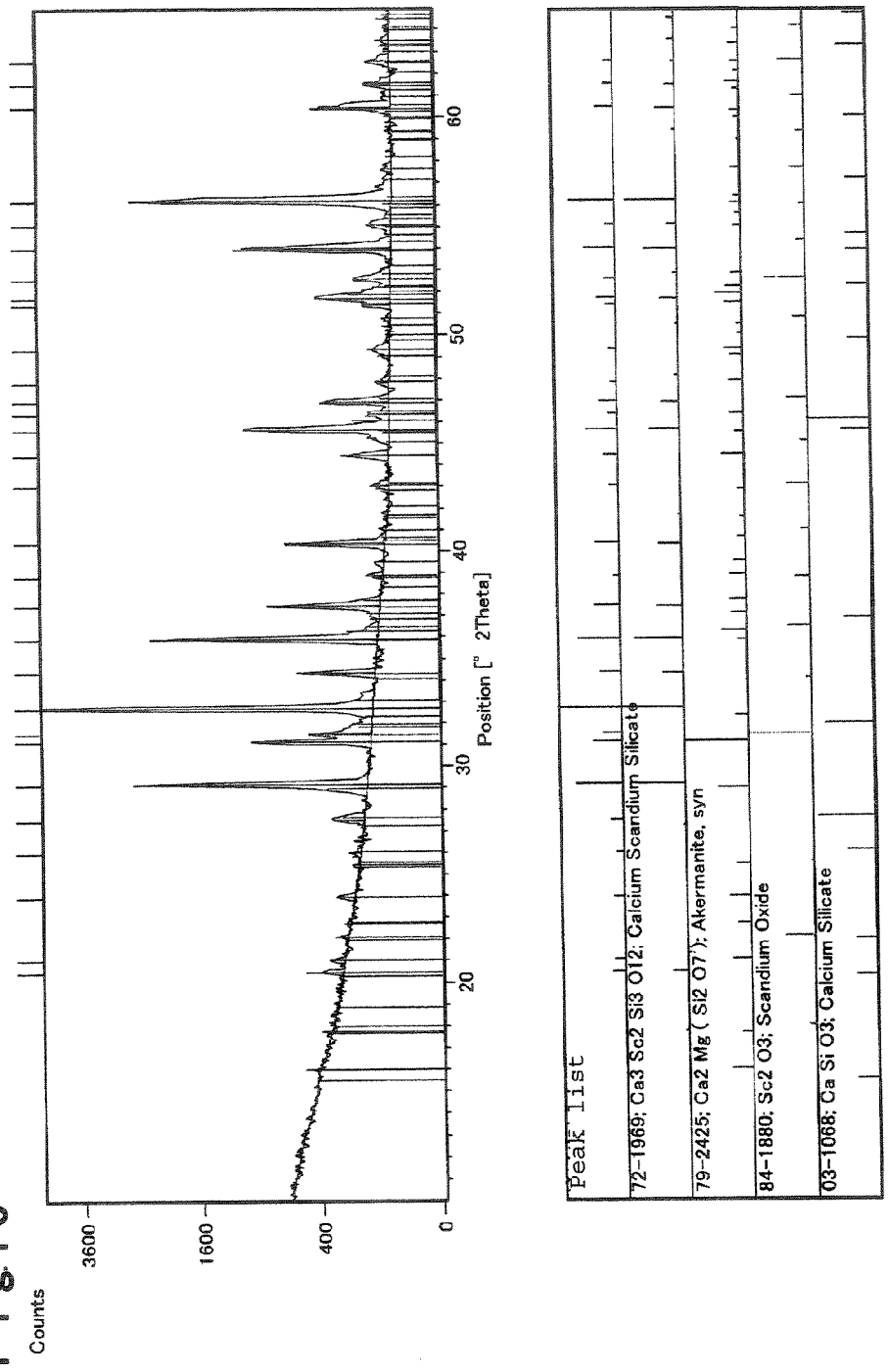
FIG. 10 is the powder X-ray diffraction pattern of the phosphor obtained in Example 5.
Figure 11:
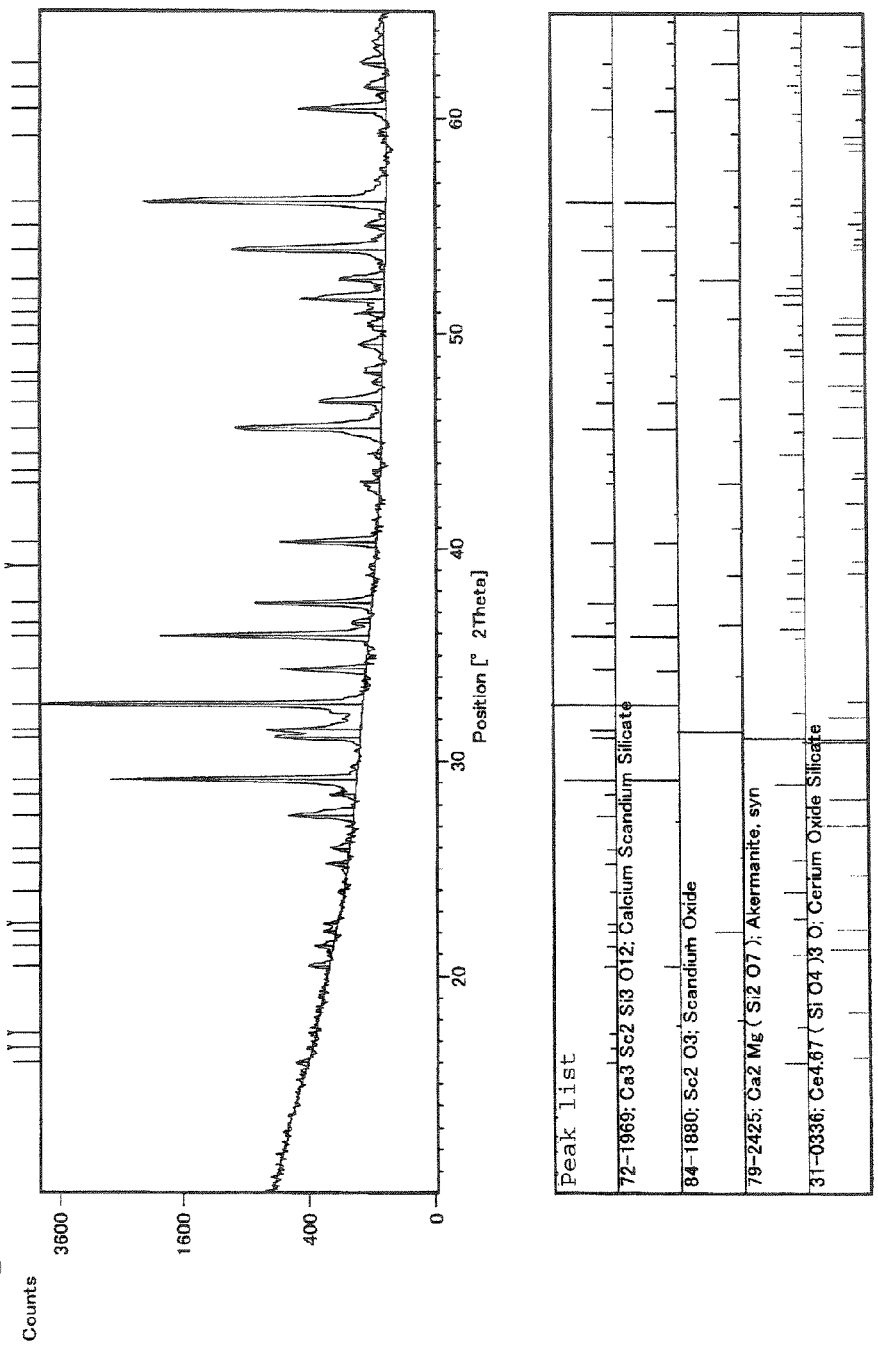
FIG. 11 is the powder X-ray diffraction pattern of the phosphor obtained in Example 7.
Figure 12:
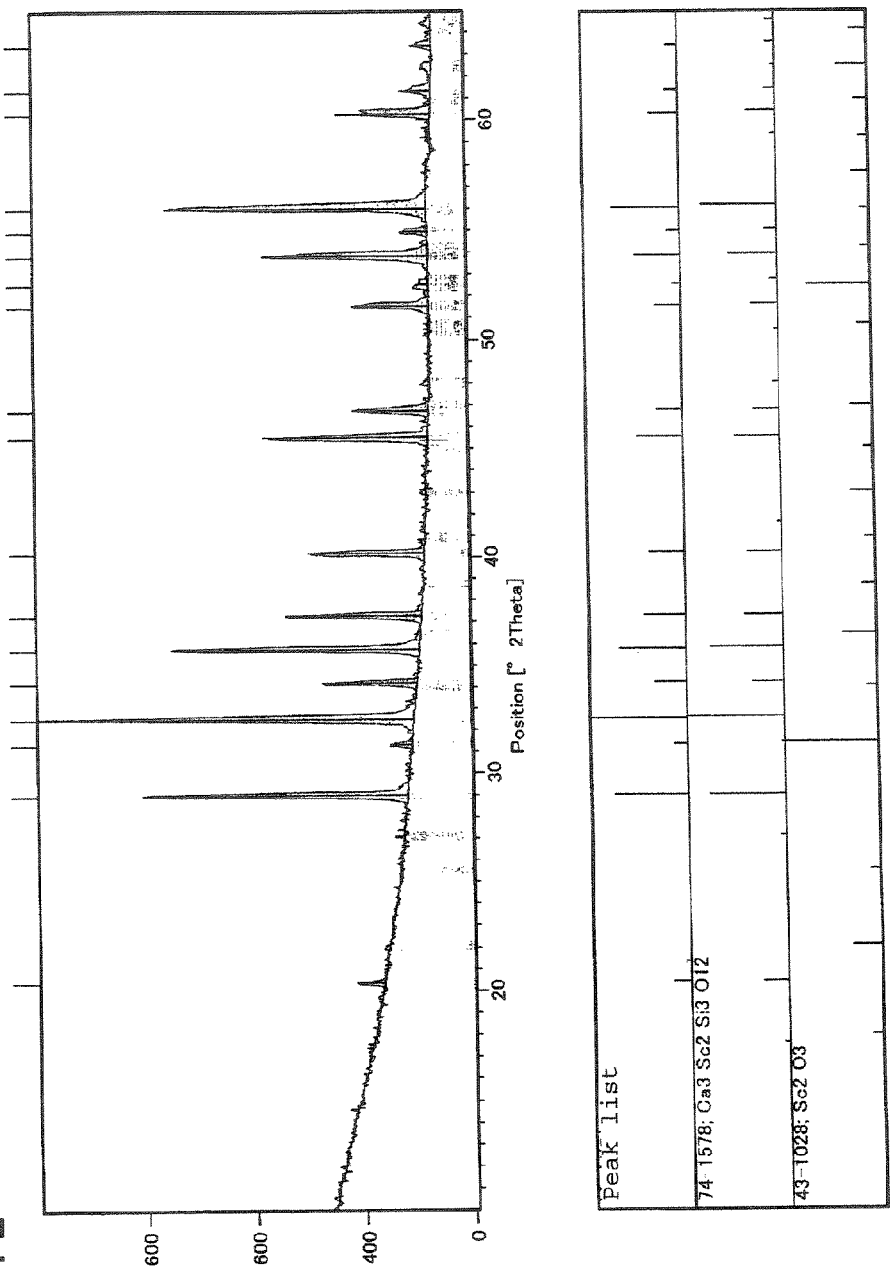
FIG. 12 is the powder X-ray diffraction pattern of the phosphor obtained in Example 14.
Figure 13:
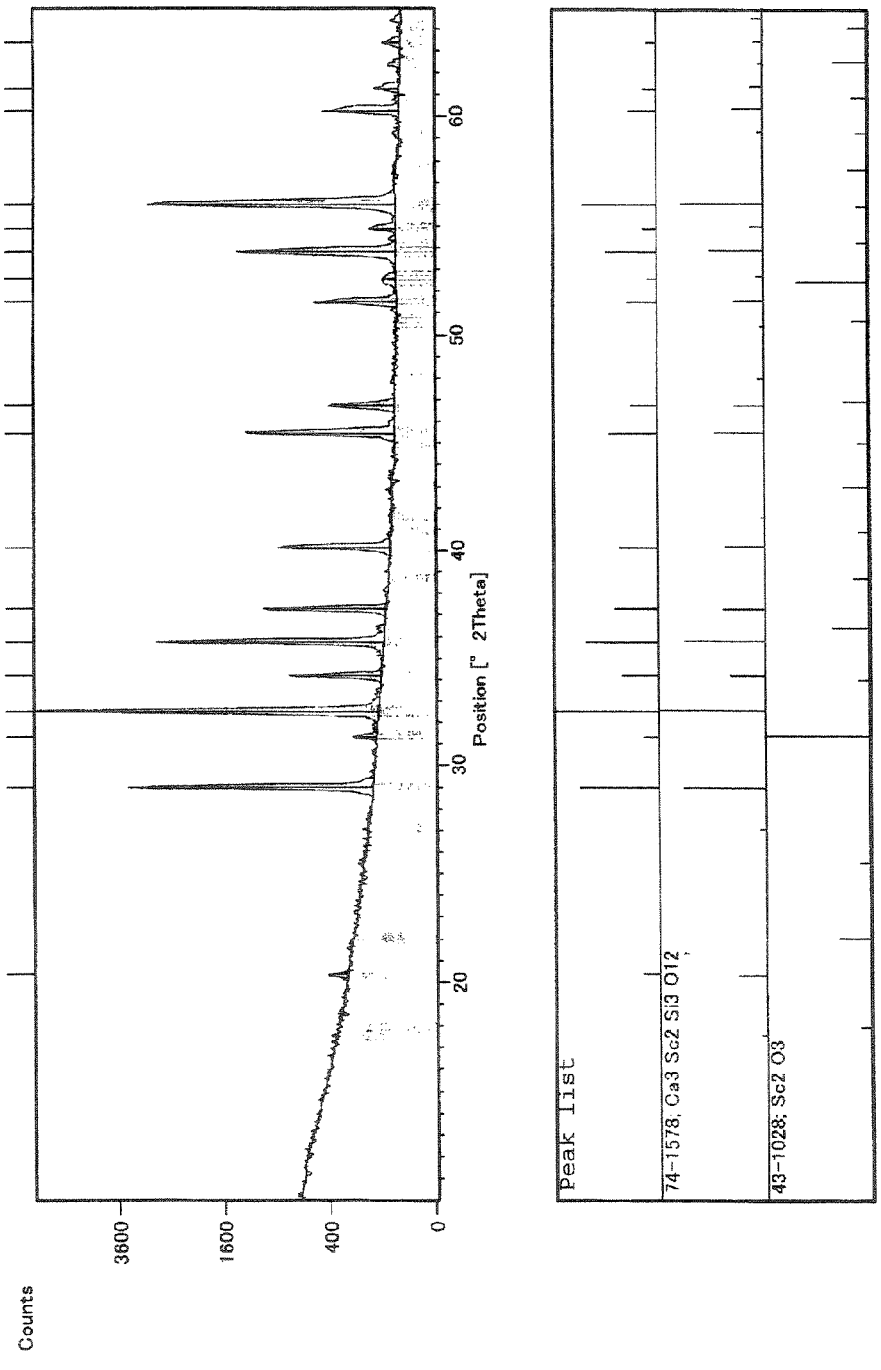
FIG. 13 is the powder X-ray diffraction pattern of the phosphor obtained in Example 15.

The obtained phosphor was analyzed by powder X-ray diffraction. The measurement was carried out by using a powder X-ray diffraction apparatus ("X'Pert MPD", manufactured by Spectris). As the X-ray source, Cu—Kα ray was used, and the voltage and the current were 45 KV and 40 mA, respectively. As a result, the phosphor was confirmed to be a compound having a garnet crystal structure. In FIG. 9, the powder X-ray diffraction pattern of this phosphor is shown.

Figure 3:
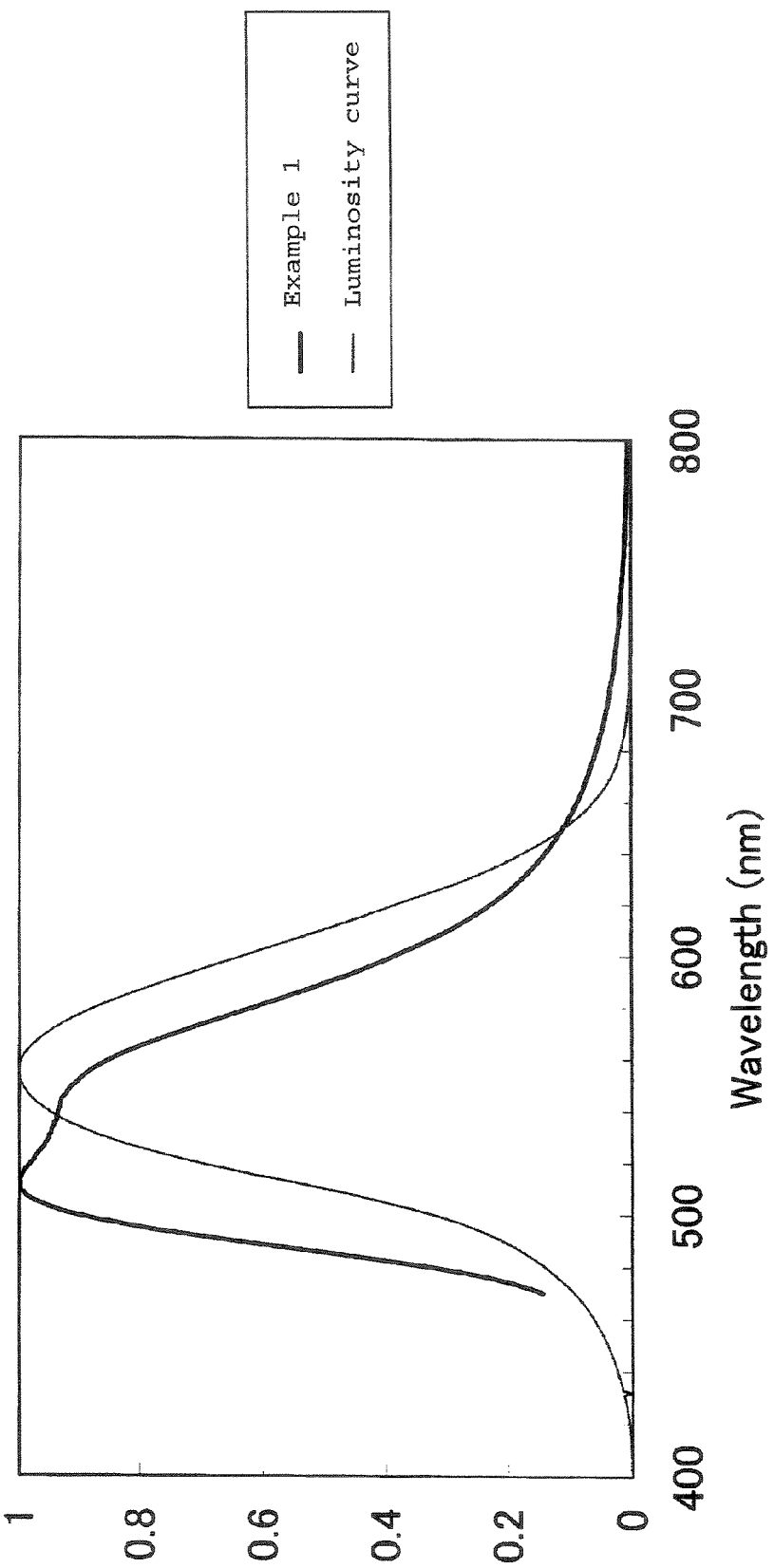
FIG. 3 is a graph showing the emission spectrum of the phosphor obtained in Example 1.

Then, the emission spectrum of this phosphor was measured by the following method, and the results are shown in FIG. 3. In FIG. 3, the luminosity curve is also shown as overlapped.

Measurement of Emission Spectrum

In a fluorescence measuring apparatus (manufactured by JASCO Corporation), a 150 W xenon lamp was employed as an excitation light source. The light of the xenon lamp was passed through a 10 cm diffraction grating spectroscope, and only a light having a wavelength of 455 nm was irradiated to the phosphor through an optical fiber. The light generated by irradiation with the excitation light was spectrally divided by a 25 cm diffraction grating spectroscope, and emission intensities at various wavelengths of from 300 nm to 800 nm were measured by a multichannel CCD detector ("C7041", manufactured by Hamamatsu Photonics K.K.). Then, via signal treatments such as sensitivity correction of detector by a personal computer, an emission spectrum was obtained. The emission peak wavelength is shown in Table 1.

Further, from the data in the wavelength region of from 480 nm to 800 nm of this emission spectrum, the color coordinates x and y in the XYZ color system as stipulated in JIS Z8701, were calculated, and the results are shown in Table 1. Further, from stimulus value Y in the XYZ color system calculated in accordance with JIS Z8724, the relative luminance was calculated on the basis that the value of stimulus value Y of the phosphor obtained in Comparative Example 1 given hereinafter, is taken as 100%, and the result is shown in Table 1. Further, the relative emission peak intensity was calculated on the basis that the emission peak intensity of the phosphor obtained in Comparative Example 1 was taken as 100%, and the result is shown in Table 1.

Comparative Example 1

Figure 5:
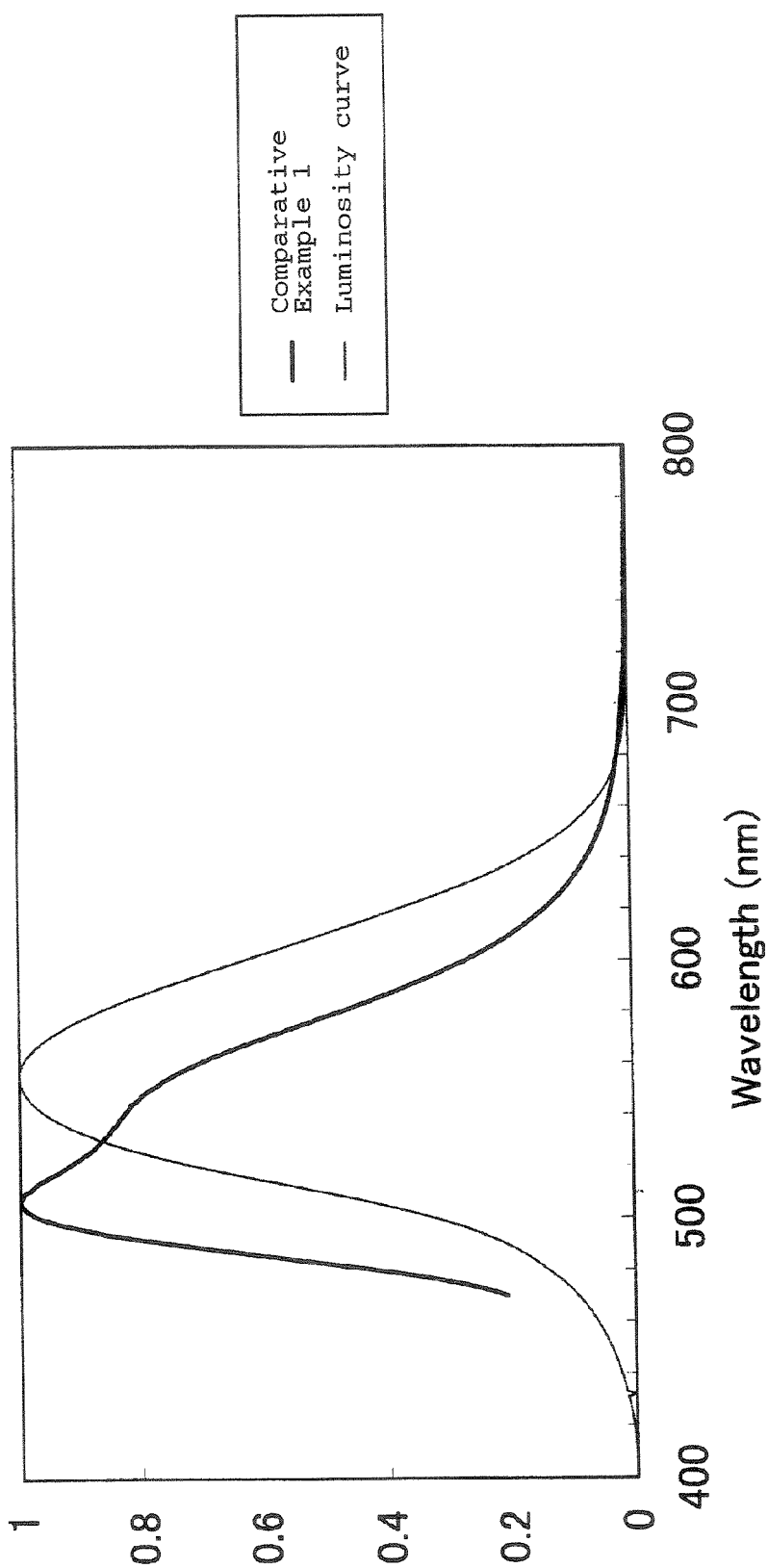
FIG. 5 is a graph showing the emission spectrum of the phosphor obtained in Comparative Example 1.

A phosphor was prepared in the same manner as in Example 1 except that the raw materials for the preparation of the phosphor were changed to 0.0297 mol of $CaCO_3$ as a $M^2$ source compound, 0.01 mol of $Sc_2O_3$ as a $M^3$ source compound, 0.03 mol of $SiO_2$ as a $M^4$ source compound and 0.0003 mol of $Ce(NO_3)_3$ (aqueous solution) as an X-source compound, and the firing temperature was changed to 1,500° C., and evaluated in the same manner, and the results are shown in Table 1. The emission spectrum of this phosphor is shown in FIG. 5. In FIG. 5, the luminosity curve is also shown as overlapped. As compared with the emission spectrum (FIG. 3) of the phosphor in Example 1, it is evident that in the emission spectrum of the phosphor in Comparative Example 1, the overlapping with the luminosity curve is small.

Examples 2 to 13 and Comparative Examples 2 and 3

Figure 4:
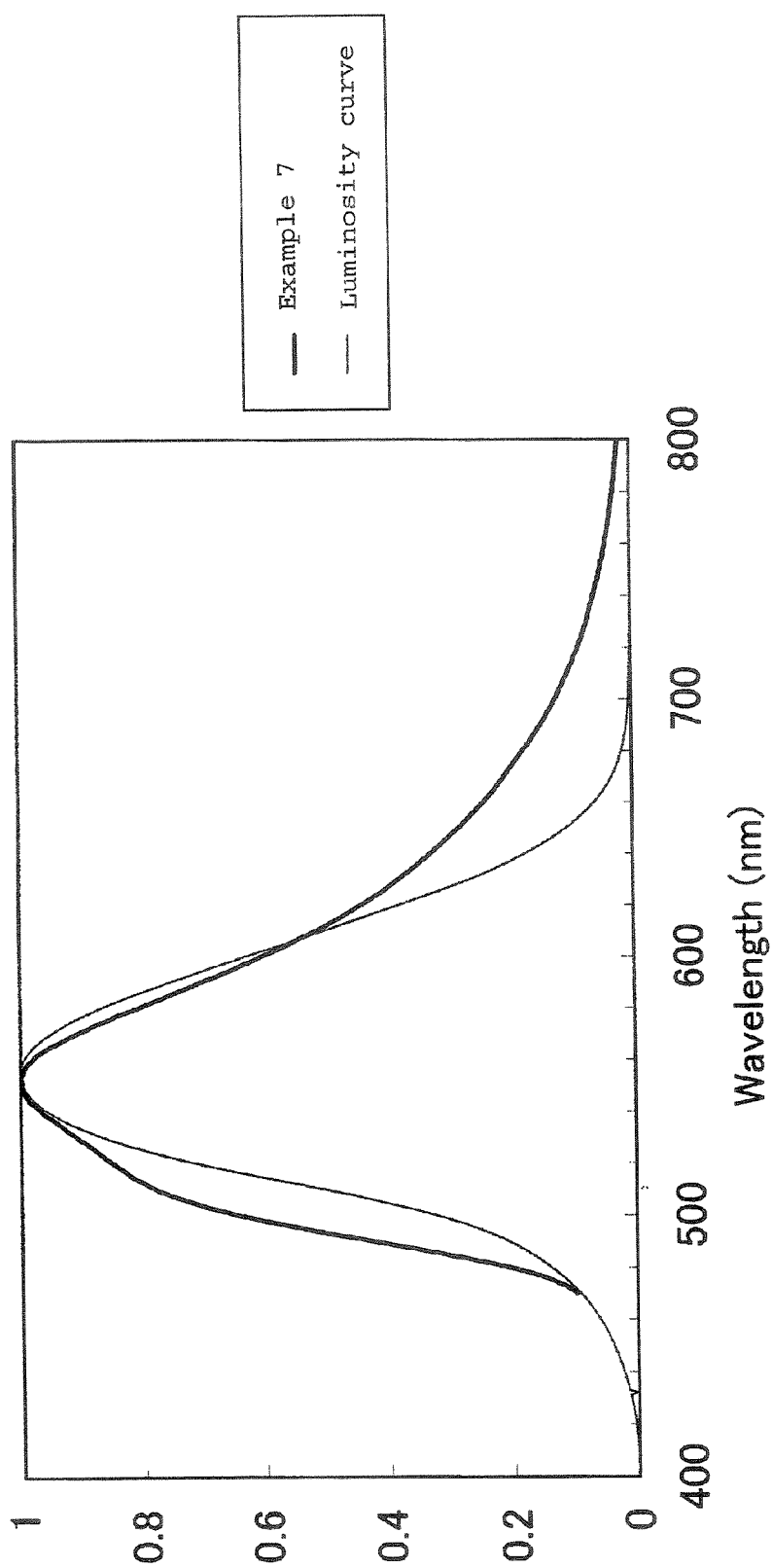
FIG. 4 is a graph showing the emission spectrum of the phosphor obtained in Example 7.

A phosphor was prepared in the same manner as in Example 1 except that the raw materials for the preparation of the phosphor were mixed in a composition as shown in Table 1 and the firing temperature was a temperature shown in Table 1, and evaluated in the same manner, and the results are shown in Table 1. Further, the emission spectrum of the phosphor obtained in Example 7 is shown in FIG. 4. When FIGS. 3 to 5 are compared, it is evident that the overlapping of the emission spectrum with the luminosity curve increases in the order of Comparative Example 1, Example 1 and Example 7. As the overlapping of the emission spectrum with the luminosity curve increases, the phosphor will be one having high luminance relative to the relative emission peak intensity.

Examples 14 to 15 and Comparative Example 4

A phosphor was prepared in the same manner as in Example 1 except that the raw materials for the preparation of the phosphor were mixed in a ratio shown in Table 1, and then the phosphor was immersed in 1 mol/L hydrochloric acid, stirred and left to stand for 12 hours to remove impurities soluble in hydrochloric acid. The phosphor not dissolved was separated from the hydrochloric acid solution, followed by treatment for washing with water (a process of pouring water, stirring, followed by solid-liquid separation, was repeated). Then, drying and sieving were carried out. In this manner, phosphors in Examples 14 and 15 and Comparative Example 4 were obtained.

The median diameters of the phosphors in Examples 14 and 15 were measured by a laser diffraction type particle size distribution measuring apparatus (La-300, manufactured by HORIBA, Ltd.) and were found to be 7.5 µm and 6.1 µm, respectively.

The compositions of the phosphors obtained in Examples 14 and 15 and Comparative Example 4 were measured by the following method.

Measurements of contents of Ca, Sc, Si, Ce and Mg

A phosphor sample was melted together with 30 times by weight of sodium carbonate, dissolved in dilute hydrochloric acid and diluted to obtain a solution to be measured, whereupon a quantitative analysis was carried out by Inductively Coupled Plasma Atomic Emission Spectrometry (ICP-AES). The solutions for the calibration curve was prepared by using a commercially available standard solution, so that it will have the same salt concentration as the sample solution.

Measurements of the Contents of Alkali Metals

To a phosphor sample, 50 times by weight of perchloric acid and hydrofluoric acid (HF) were added and heated until white fume generation ended, and hydrochloric acid was added, followed by heating and then diluting to obtain a solution to be measured. Na was quantified by Atomic Absorption Spectrometry (AAS), and Li was quantified by Inductively Coupled Plasma Atomic Emission Spectrometry (ICP-AES). The solutions for the calibration curve was prepared by using a commercially available standard solution, so that it had the same acid concentration as the sample solution.

From the results of these measurements, the ratios of the respective component atoms in the phosphor were obtained on the basis that the composition of silicon was taken as 3. The results are shown in Table 2.

FIGS. 9 to 13 show the powder X-ray diffraction patterns of the phosphors of the present invention obtained in Examples 1, 5, 7, 14 and 15.

With the phosphors in Examples 1, 5 and 7, the diffraction line of a phosphor of a garnet structure which agrees to the JCPDS standard chart No. 72-1969, was detected as the main component. In addition, diffraction lines attributable to impurity phases which agree to $Sc_2O_3$ (JCPDS No. 84-1880, 88-2159), $CaSiO_3$ (JCPDS No. 3-1068, 1-720), $Ca_2MgSi_2O_7$ (JCPDS No. 79-2425), $Ce_{4.67}(SiO_4)_3O$ (JCPDS No. 31-336), etc., were observed. The reason for the detection of the impurity phases is that these phosphors were not subjected to washing treatment.

On the other hand, in the diffraction patterns of the phosphors in Examples 14 and 15 which were subjected to acid washing treatment, only the diffraction line of a phosphor of a garnet structure and the diffraction line attributable to $Sc_2O_3$ as an impurity phase, were detected. Impurity phases other than $Sc_2O_3$ were dissolved and removed by the acid washing.

Figure 6:
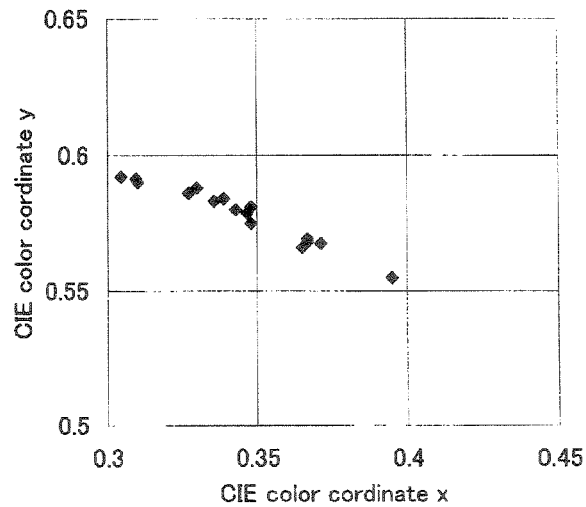
FIG. 6 is a graph having plotted all of the CIE color coordinates of Examples 1 to 15 and Comparative Example 1.

FIG. 6 is a graph wherein the CIE color coordinates in Examples 1 to 15 and Comparative Example 1 are all plotted. As shown in FIG. 6, they are plotted substantially on one line. It is evident that by the increase in the Mg amount and the corresponding increase in the amount of Ce present in the crystal, x becomes large, y becomes small, and the emission color tends to be increasingly reddish.

Figure 7:
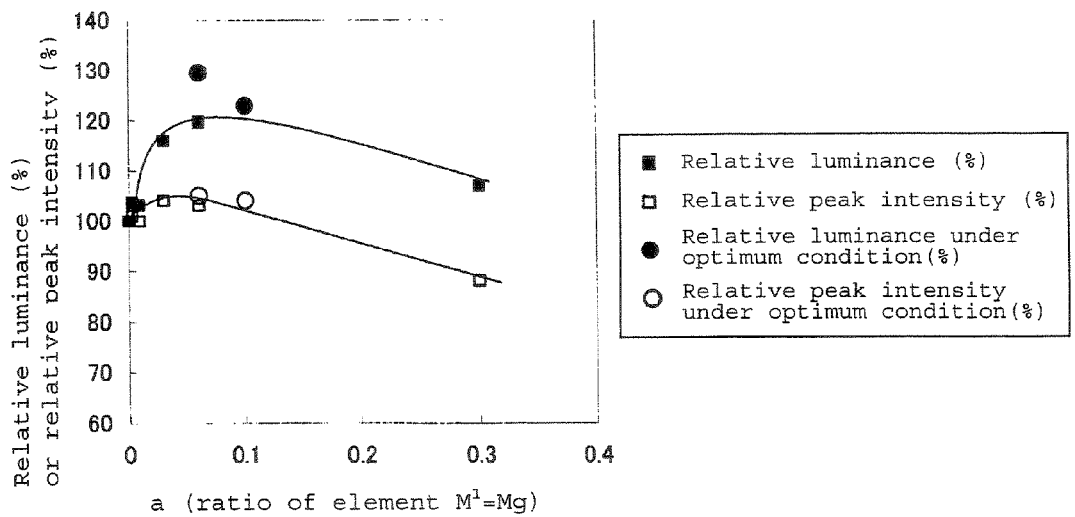
FIG. 7 is a graph showing the relation of the relative luminance and the relative emission peak intensity to the shift of the emission peak wavelength by an addition of Mg in a case where the Ce compositional ratio is 0.03, from the data in Examples (the abscissa represents value x in the CIE color coordinates).

FIG. 7 is a graph simply showing from the data in Examples the relation between the relative luminance (represented by ■ in FIG. 7) and the relative emission peak intensity (represented by □ in FIG. 7) by the addition of Mg in a case where the Ce compositional ratio is 0.03. When the amount of Mg is increased, the relative emission peak intensity increases a little and then decreases substantially. On the other hand, the luminance increases substantially and then decreases, but with each of the phosphors in Examples of the present invention, the luminance is higher than the luminance (the relative luminance=100) of the phosphor in Comparative Example 1. This is considered attributable to the fact that the overlapping of the standard luminosity curve and the emission spectrum increased, whereby the luminance increased, and its effects compensated the decrease in the peak intensity. Further, the relative luminance (represented by ● in FIG. 7) and the relative emission peak intensity (represented by ○ in FIG. 7) of the phosphors obtained in Examples 12 and 13 are shown in Table 7. It is evident that phosphors having very high luminance can be obtained by thus adjusting the conditions for e.g. the mixing ratio of raw materials within the scope of the present invention.

Figure 8:
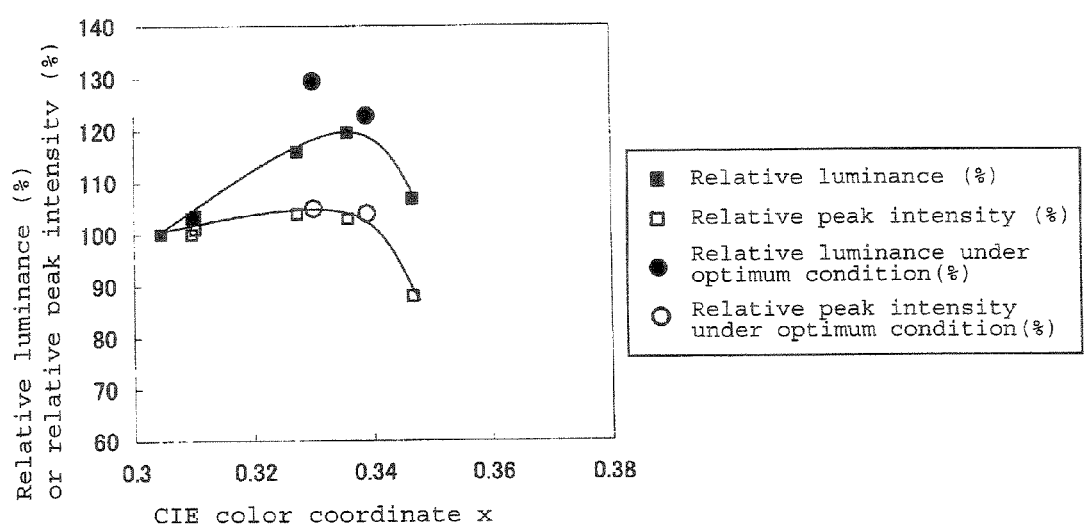
FIG. 8 is a graph showing the relation of the relative luminance and the relative emission peak intensity to the shift of the emission peak wavelength by an addition of Mg in a case where the Ce compositional ratio is 0.03, from the data in Examples (the abscissa represents the amount of Mg).

Also FIG. 8 is a graph simply showing from the data in Examples the relation between the relative luminance (represented by ■ in FIG. 8) and the relative emission peak intensity (represented by □ in FIG. 8) by the addition of Mg in a case where the Ce compositional ratio is 0.03. In FIG. 8, the abscissa represents value x in the CIE color coordinates, and the ordinate represents the relative emission peak intensity and the relative luminance. As the color coordinate value x increases by an increase in the amount of Mg i.e. as the emission peak shifts towards a long wavelength side, the relative emission peak intensity increases slightly and then decreases substantially. On the other hand, the relative luminance increases substantially and then decreases. However, with each of the phosphors in Examples of the present invention, the luminance is higher than the luminance (relative luminance=100) of the phosphor in Comparative Example 1. This is considered attributable to the fact that the overlapping of the standard luminosity curve and the emission spectrum increased, whereby the luminance increased and its effects compensated for the decrease in the peak intensity. Further, the relative luminance (represented by ● in FIG. 8) and the relative emission peak intensity (represented by ○ in FIG. 8) of the phosphors obtained in Examples 12 and 13 are shown in FIG. 8. It is evident that phosphors having very high luminance can be obtained by thus adjusting the conditions for e.g. the mixing ratio of raw materials within the scope of the present invention.

Evaluation of Light-Emitting Device

Example 16

Figure 17:
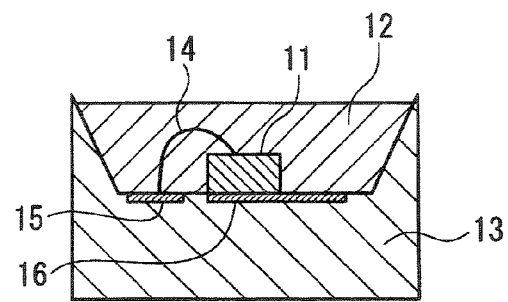
FIG. 17 is a diagrammatical cross-sectional view illustrating a surface mounted type white LED.

Using the phosphor prepared in Example 14, a surface mounting type white LED as shown in FIG. 17 was prepared, and its evaluation was carried out.

Firstly, LED for emitting light with a wavelength of 460 nm (C460-MB290-S0100 manufactured by Cree Company; MB grade, light output power: 9 to 10 mW) was bonded by means of a silver paste (conductive mounting material) to a terminal 16 of a cup portion of a frame 13 for surface mounting type LED. Then, using a gold wire (conductive wire) 14 having a diameter of 20 μm, an electrode of LED 11 and a terminal 15 of the frame 13 were connected.

A red phosphor $Ca_{0.992}AlSiEu_{0.008}N_{2.85}O_{0.15}$ and the green phosphor in Example 14 were mixed in a weight ratio of 4/96. To 1 g of this phosphor mixture, 10 g of a silicone resin was thoroughly mixed. Here, the red phosphor $Ca_{0.992}AlSiEu_{0.008}N_{2.85}O_{0.15}$ was prepared by the method disclosed in WO2005/052087A1.

The mixture of the phosphors and the resin, obtained as described above, was poured into the cup portion of the frame 13 having LED 11 bonded. This poured mixture was maintained at 150° C. for 1 hour to cure the silicone resin thereby to form a phosphor-containing resin portion 12, whereby a surface mounting type white LED was obtained.

The emission spectrum of the surface mounting type white LED obtained as described above, was measured by using the HR2000 system of Ocean Optics Inc. The optical system comprising a spectrometer, an integrating sphere, an optical fiber, etc., was corrected by using a standard lamp having the luminescence distribution corrected, and the measured value was one having such corrected data reflected. Further, the portions not described in detail in the measurement or calculation method, were in accordance with JIS Z8724, Z8725, Z8701 and Z8726.

Figure 14:
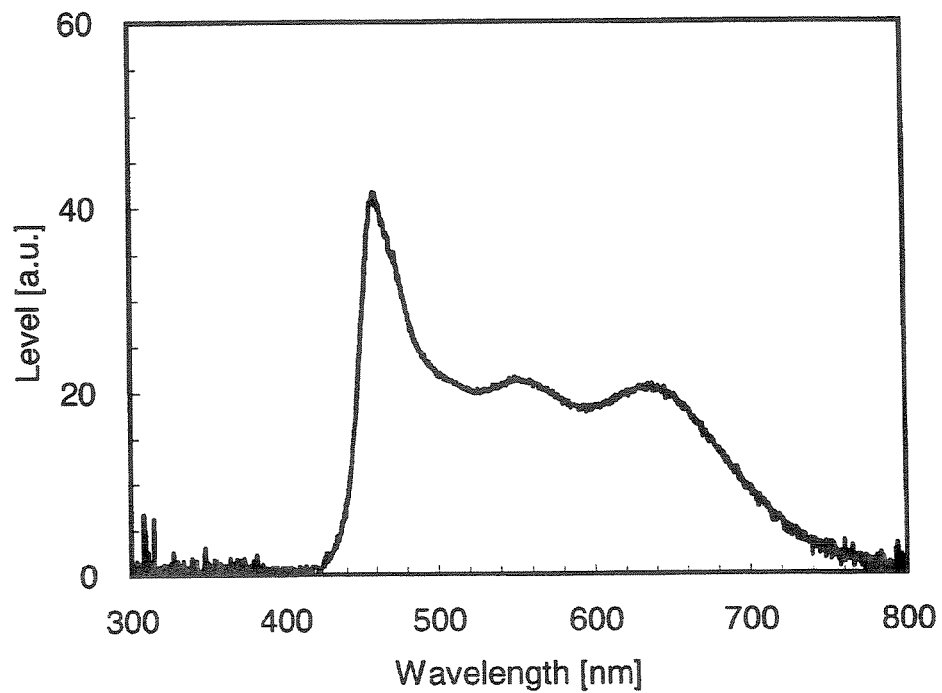
FIG. 14 is a graph showing the emission spectrum of the surface mounted type white LED obtained in Example 16.

The white LED was activated at 20 mA at room temperature (about 24° C.). All emission from the white LED was received by the integrating sphere and then introduced into the spectrometer by an optical fiber, whereby the emission spectrum was measured. With respect to the emission spectrum data, the numerical values of the emission intensity were recorded every 5 nm within a range of from 380 nm to 780 nm. The obtained emission spectrum of the white LED is shown in FIG. 14. On this basis, the CIE color coordinates x and y were obtained and found to be x=0.319 and y=0.336. Further, the relative color temperature (Tcp), the general color rendering index Ra and the values of other color rendering index R1 to R15 were also obtained, and they are shown in Table 3.

Comparative Example 5

Figure 15:
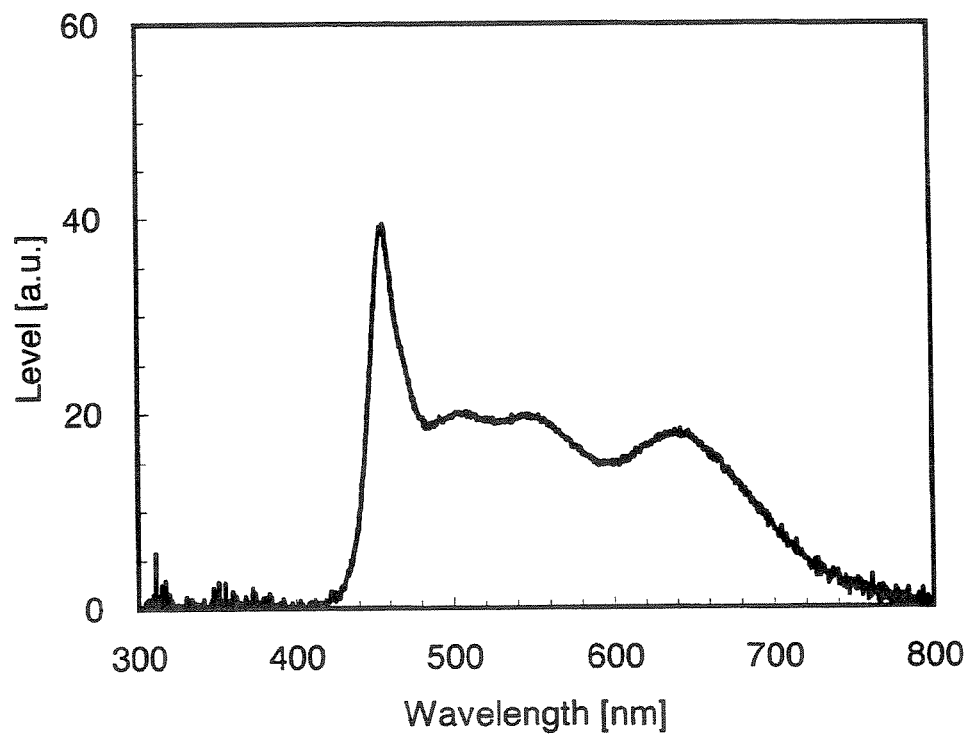
FIG. 15 is a graph showing the emission spectrum of the surface mounted type white LED obtained in Comparative Example 5.

A surface mounting type white LED was prepared in the same manner as in Example 16 except that the phosphor prepared in Comparative Example 1 was used as the green phosphor, and its evaluation was carried out. The measured emission spectrum is shown in FIG. 15. On this basis, the CIE color coordinates x and y were obtained and found to be x=0.314 and y=0.336. Further, the relative color temperature (Tcp) and the values of the average color rendering index Ra, etc., were also obtained, and they are shown in Table 3.

Comparative Example 6

Figure 16:
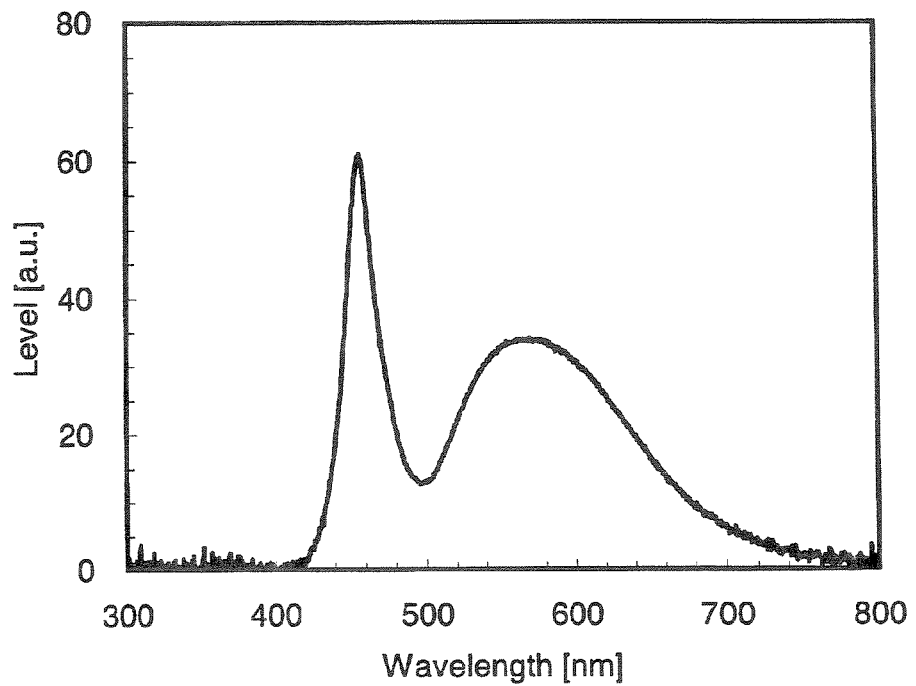
FIG. 16 is a graph showing the emission spectrum of the surface mounted type white LED obtained in Comparative Example 6.

A surface mounting type white LED was prepared in the same manner as in Example 16 except that a phosphor represented by a compositional formula $(Y_{0.85},Tb_{0.15},Ce_{0.1})_3Al_5O_{12}$ (so-called YAG phosphor) was used as the green phosphor, and its evaluation was carried out. The measured emission spectrum is shown in FIG. 16. On this basis, the CIE color coordinates x and y were obtained and found to be x=0.336 and y=0.335. Further, the relative color temperature (Tcp) and the values of the general color rendering index Ra, etc., were also obtained, and they are shown in Table 3.

Example 17

Together with a small amount of ethanol, raw materials comprising 0.003 mol, as Mg, of $Mg(OH)_2 \cdot 3MgCO_3 \cdot 3H_2O$ as $M^1$ source compound, 0.027 mol of $CaCO_3$ as a $M^2$ source compound, 0.0085 mol of $Sc_2O_3$ as a $M^3$ source compound, 0.03 mol of $SiO_2$ as a $M^4$ source compound, and 0.003 mol of $CeO_2$ as an X source compound, were put into an agate mortar, thoroughly mixed and then dried. Then, the dried raw material mixture was wrapped by a platinum foil and fired by heating at 1,400° C. for 3 hours while a nitrogen gas containing 4 vol % of hydrogen as supplied. Then, it was pulverized, and then washing treatment by 2 mol/L hydrochloric acid, washing with water, drying and classification treatment were sequentially carried out to obtain a phosphor (composition: $Ca_{2.7}Ce_{0.3}Sc_{1.7}Mg_{0.3}Si_3O_{12}$).

By the analysis by the powder X-ray diffraction, the obtained phosphor was confirmed to be a compound wherein the main component had a garnet crystal structure. Further, the emission spectrum of this phosphor was measured by the following method and shown in FIG. 18.

Measurement of Emission Spectrum

Using a spectrofluorometer (F-4500 model, manufactured by Hitachi, Ltd.), the fluorescence spectrum was measured. The phosphor sample was put into a circular cell of a solid sample cell holder as an option component of the same apparatus. The measuring conditions were as follows.

Measuring mode: Fluorescence
Excitation wavelength: 455 nm.
Slit width: Excitation side=5 nm, fluorescence side=5 nm
Scanning speed: 240 nm/min
Photomultiplier voltage: 400 V
Spectrum correction: Yes Further, from the data in the wavelength region of from 480 nm to 800 nm of this emission spectrum, the color coordinates x and y in the XYZ color system stipulated in JIS Z8701 were calculated, and the results are shown in Table 4-A. Further, the relative luminance calculated from stimulus value Y in the XYZ color system calculated in accordance with JIS Z8727 on the basis that the value of stimulus value Y of the phosphor obtained in Comparative Example 7 given hereinafter was taken as 100%, the emission peak wavelength λ read-out, the half value width W(½) and ¼ height width W(¼) are shown in Table 4-A.

Comparative Example 7

Together with pure water, 1.05 mmol of $Y_2O_3$, 0.39 mol of $Gd_2O_3$, 2.5 mol of $Al_2O_3$, 0.12 mol of $CeO_2$ and 0.25 mol of BaF$_2$ as a flux were pulverized and mixed in a wet system ball mill comprising an alumina container and beads, then dried and passed through a nylon mesh. The obtained pulverized mixture was fired by heating 1,450° C. for two hours under the atmospheric pressure in an alumina crucible. Then, washing with water, drying and classifying treatment were carried out to obtain a (Y$_{0.7}$Gd$_{0.26}$Ce$_{0.004}$)$_3$Al$_5$O$_{12}$ phosphor.

Figure 18:
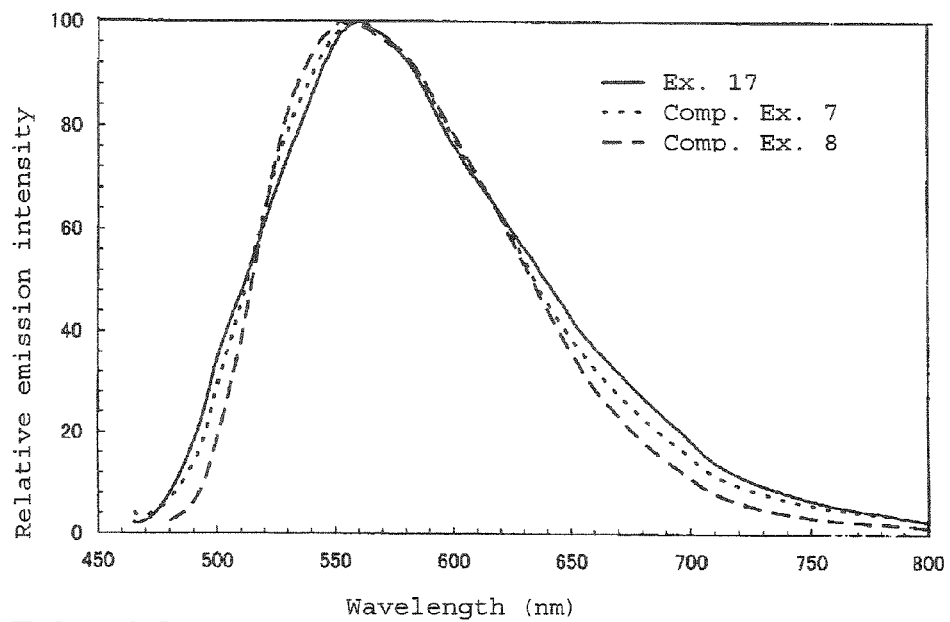
FIG. 18 is a graph showing the fluorescence spectra of the phosphors obtained in Example 17 and Comparative Examples 7 and 8.

With respect to this phosphor, the same evaluation as in Example 17 was carried out, and the results are shown in FIG. 18 and in Table 4-A.

Comparative Example 8

A phosphor (composition: Ca$_{1.47}$Ce$_{0.03}$Mg$_{1.5}$Sc$_{1-5}$Y$_{0.5}$Si$_3$O$_{12.015}$) was prepared in the same manner as in Example 17 except that the raw materials for preparation of the phosphor were changed to 0.015 mol, as Mg, of Mg(OH)$_2$. 3MgCO$_3$.3H$_2$O as a M$^1$ source compound, 0.0147 mol of CaCO$_3$ as a M$^2$ source compound, 0.0075 mol of Sc$_2$O$_3$ and 0.0025 mol of Y$_2$O$_3$ as M$^3$ source compounds, 0.03 mol of SiO$_2$ as a M$^4$ source compound and 0.0003 mol of Ce(NO$_3$)$_3$ (aqueous solution) as an X source compound.

With respect to this phosphor, the same evaluation as in Example 17 was carried out, and the results are shown in FIG. 18 and in Table 4-A.

Evaluation of Light-Emitting Device

Using the phosphor prepared in Example 17 or in Comparative Example 7, a surface mounting type white LED as shown in FIG. 17 was prepared in the following manner, and its evaluation was carried out.

Firstly, LED 11 which emits light with a wavelength of 460 nm (C460-MB290-S0100 manufactured by Cree Company; MB grade, light output power: 9 to 10 mW) was bonded by means of a silver paste (conductive mounting material) to a terminal 16 of a cup portion of a frame 13 for surface mounting type LED. Then, using a gold wire (conductive wire) 14 having a diameter of 20 µm, an electrode of LED 11 and a terminal 15 of the frame 13 were connected.

To 1 g of the phosphor, 10 g of a silicone resin was thoroughly mixed, and this mixture of the phosphor and the resin was poured into the cup portion of the frame 13 having LED 11 bonded. The poured mixture was held at 150° C. for two hours to cure the silicone resin thereby to form a phosphor-containing resin portion 12, whereby a surface mounting type white LED was obtained.

The emission spectrum of the surface mounting type white LED obtained as described above, was measured, and the color rendering property evaluation number was calculated from the spectrum.

Figure 19:
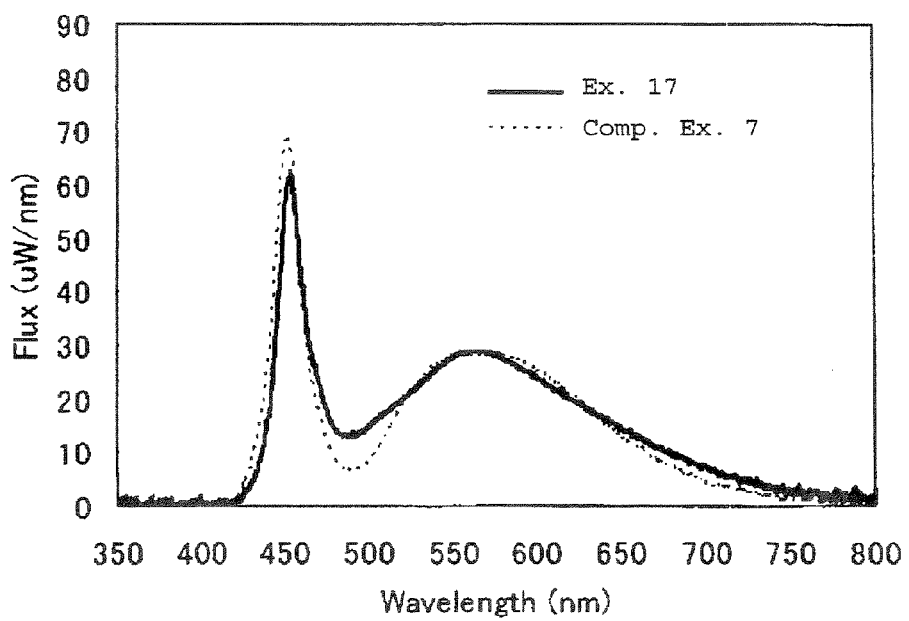
FIG. 19 is a graph showing the emission spectra of the light-emitting devices prepared by using the phosphors obtained in Examples 17 and Comparative Example 7.

Further, the white LED was activated at 20 mA at room temperature (about 24° C.) All emission from the white LED was received by the integrating sphere and then introduced into the spectrometer by an optical fiber, whereby the emission spectrum and the total luminous flux were measured. The emission spectra of the light-emitting devices prepared by using the phosphors in Example 17 and Comparative Example 7 are shown in FIG. 19. For the data of the emission spectra, the numerical values of the emission intensity were recorded every 5 nm within a wavelength range of from 380 nm to 780 nm. On this basis, the CIE color coordinates x and y, the general color rendering index Ra, and further the total luminous flux were obtained, and these results are shown in Table 4-B.

From Tables 4-A and B, it is evident that with the phosphor of the present invention whereby the emission peak wavelength λ (nm), the half value width W(½) (nm) and/or the ¼ height width W(¼) (nm) satisfies the specific relational formula, it is possible to construct a light-emitting device having high color rendering properties and high luminance.

Example 18

Together with a small amount of ethanol, the following raw materials were put into an agate mortar and thoroughly mixed, and then dried in an oven at 120° C.
CaCO$_3$: 0.0295 mol
Sc$_2$O$_3$: 0.01 mol
SiO$_2$: 0.03 mol
Ce(NO$_3$)$_3$ (aqueous solution): 0.0005 mol
Na$_2$CO$_3$: 0.0005 mol Then, the dried raw material mixture was wrapped by a platinum foil and fired by heating at 1,450° C. for 3 hours in the atmosphere, while nitrogen gas containing 4 vol % of hydrogen was supplied, followed by pulverization, washing with hydrochloric acid, washing with water and classification treatment to obtain a phosphor.

Figure 27:
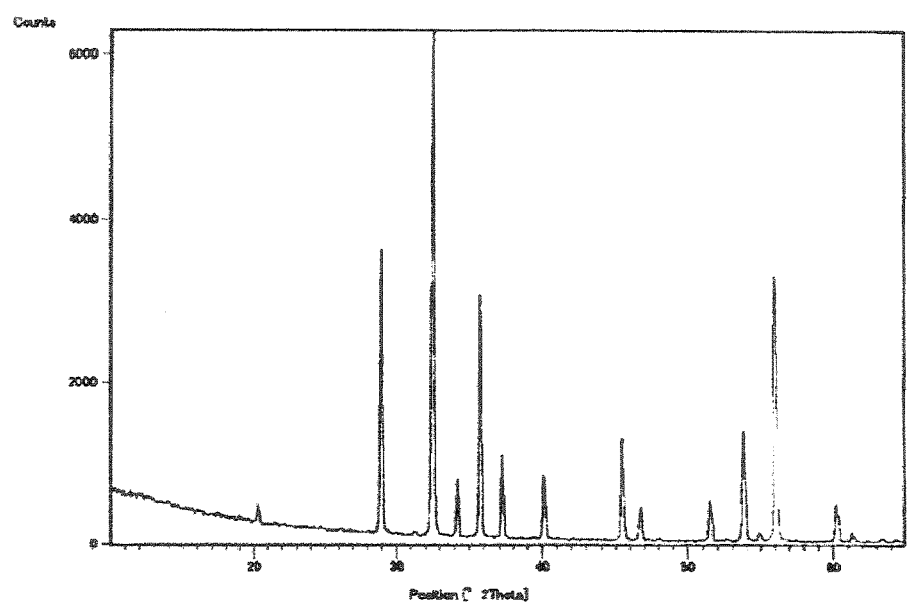
FIG. 27 is the powder X-ray diffraction pattern of the phosphor obtained in Example 18.
Figure 28:
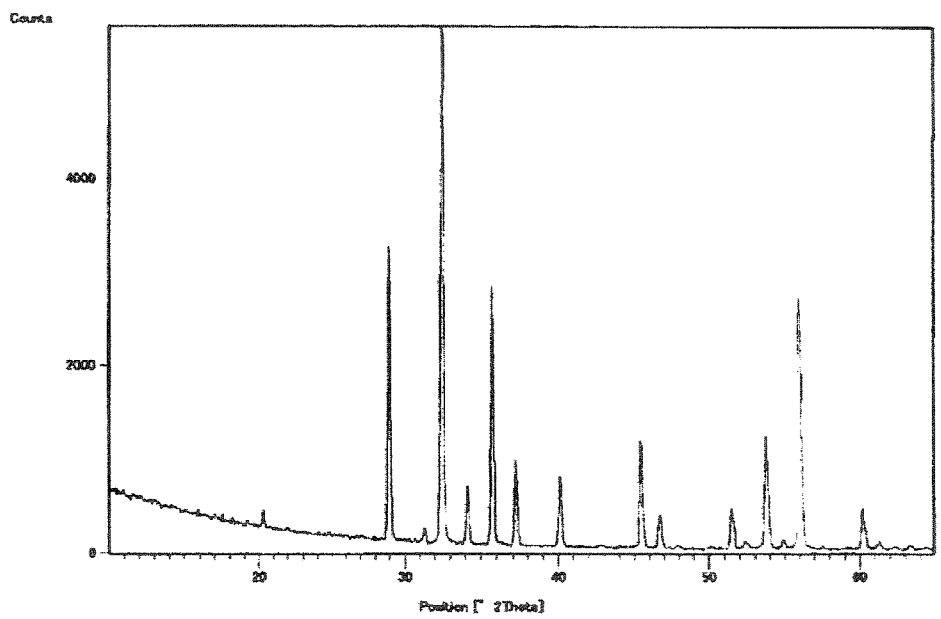
FIG. 28 is the powder X-ray diffraction pattern of the phosphor obtained in Example 19.
Figure 29:
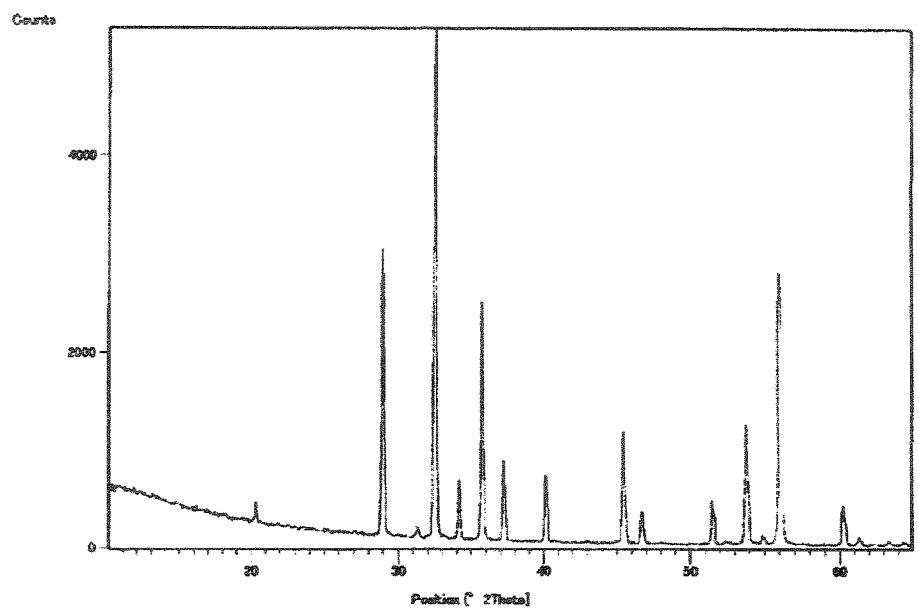
FIG. 29 is the powder X-ray diffraction pattern of the phosphor obtained in Example 20.
Figure 30:
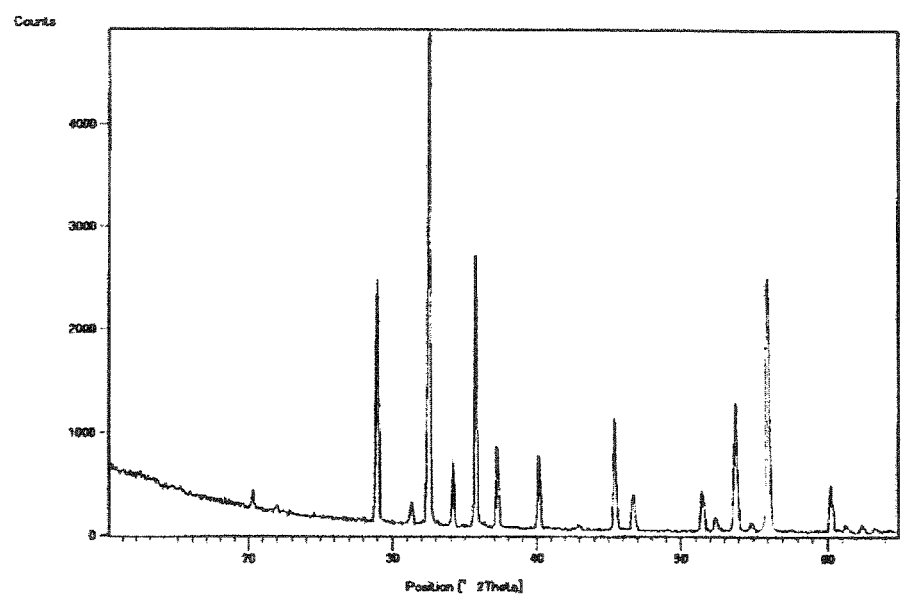
FIG. 30 is the powder X-ray diffraction pattern of the phosphor obtained in Example 21.
Figure 31:
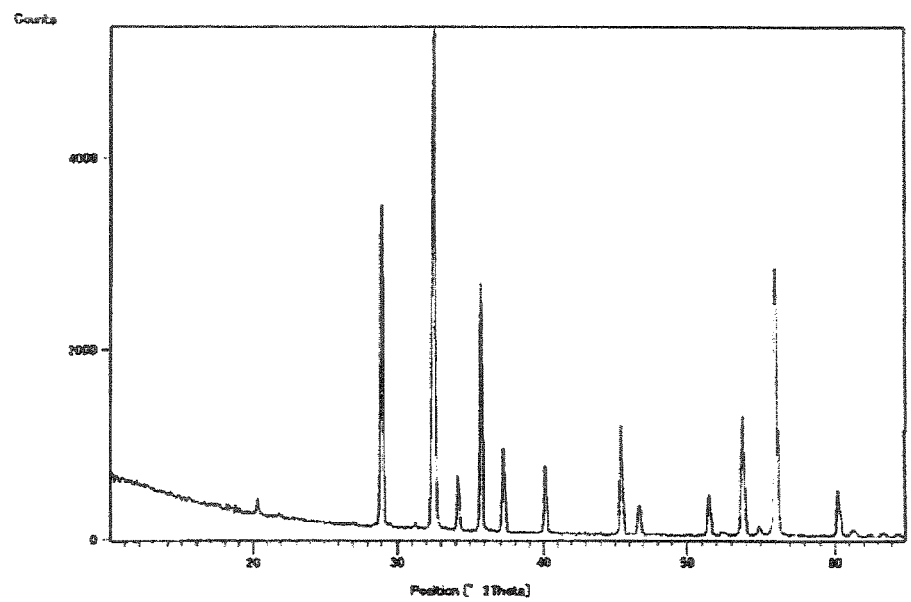
FIG. 31 is the powder X-ray diffraction pattern of the phosphor obtained in Example 22.
Figure 33:
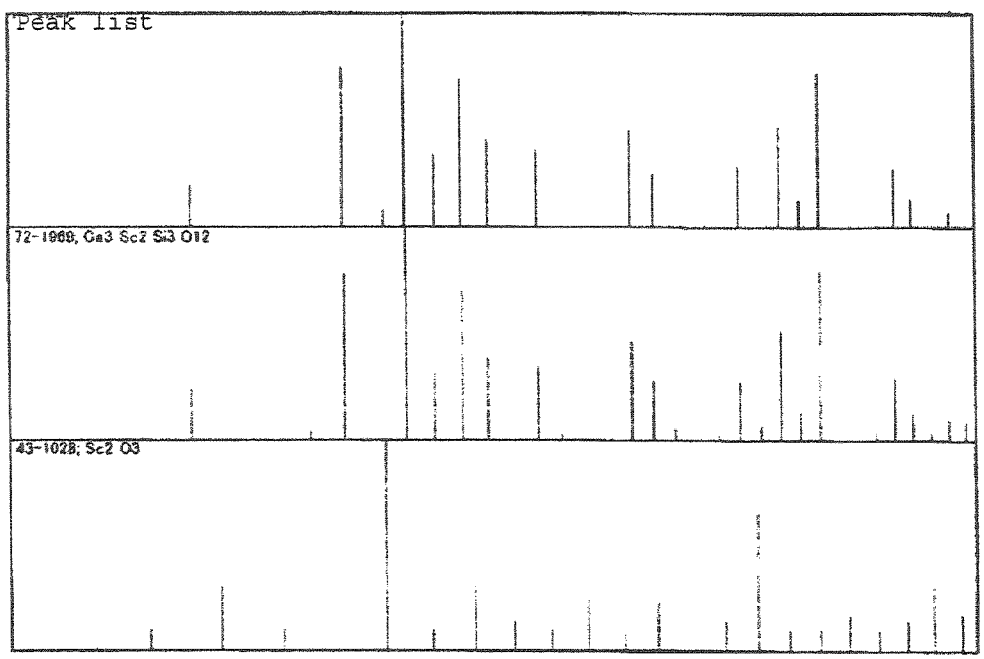
FIG. 33 is a chart showing a comparison of the powder X-ray diffraction pattern of the phosphor obtained in Example 18 with the JCPDS standard patterns of garnet $Ca_3Sc_2Si_3O_{12}$ and scandium oxide $Sc_2O_3$.

FIG. 33 is a chart showing a comparison of the powder X-ray diffraction pattern of the phosphor obtained in Example 18 with the standard patterns by JCPDS of garnet Ca$_3$Sc$_2$Si$_3$O$_{12}$ and scandium oxide Sc$_2$O$_3$. By the analysis by the powder X-ray diffraction, the obtained phosphor was confirmed to be a compound having a garnet crystal structure, as shown in FIG. 33. In FIG. 27, the powder X-ray diffraction pattern of this phosphor is shown.

Further, the composition of the obtained phosphor was measured by the following method.

Measurements of Contents of Ca, Sc, Si, Ce and Mg

A phosphor sample was melted together with 30 times by weight of sodium carbonate, dissolved in dilute hydrochloric acid and diluted to obtain a solution to be measured, whereupon a quantitative analysis was carried out by Inductively Coupled Plasma Atomic Emission Spectrometry (ICP-AES). The solutions for the calibration curve was prepared by using a commercially available standard solution, so that it will have the same salt concentration as the sample solution.

Measurements of the Contents of Alkali Metals

To a phosphor sample, 50 times by weight of perchloric acid and hydrofluoric acid (HF) were added and heated for white fume treatment, and hydrochloric acid was added, followed by heating and then diluting to obtain a solution to be measured. Na was quantified by an atomic absorption spectrometry (AAS), and Li was quantified by Inductively Coupled Plasma Atomic Emission Spectrometry (ICP-AES). The solutions for the calibration curve was prepared by using a commercially available standard solution, so that it had the same acid concentration as the sample solution.

From the results of these measurements, the ratios of the respective component atoms in the phosphor were obtained on the basis that the composition of silicon was taken as 3. The results are shown in Table 5.

Figure 20:
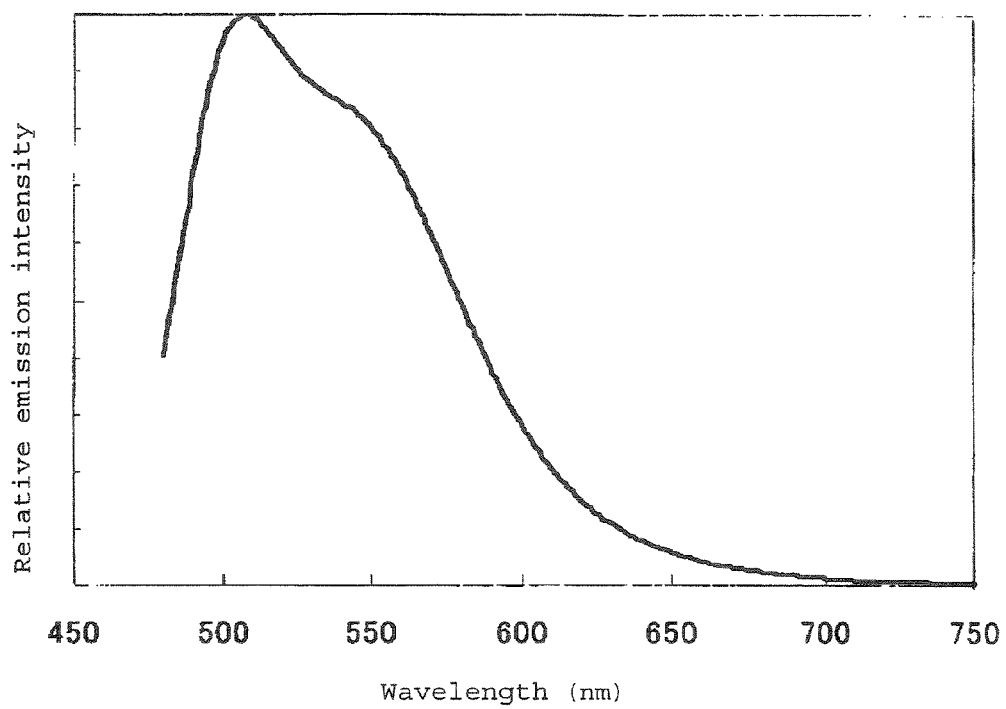
FIG. 20 is the emission spectrum of the phosphor obtained in Example 18 (provided that the vicinity of the excitation light wavelength (455 nm) is omitted).
Figure 21:
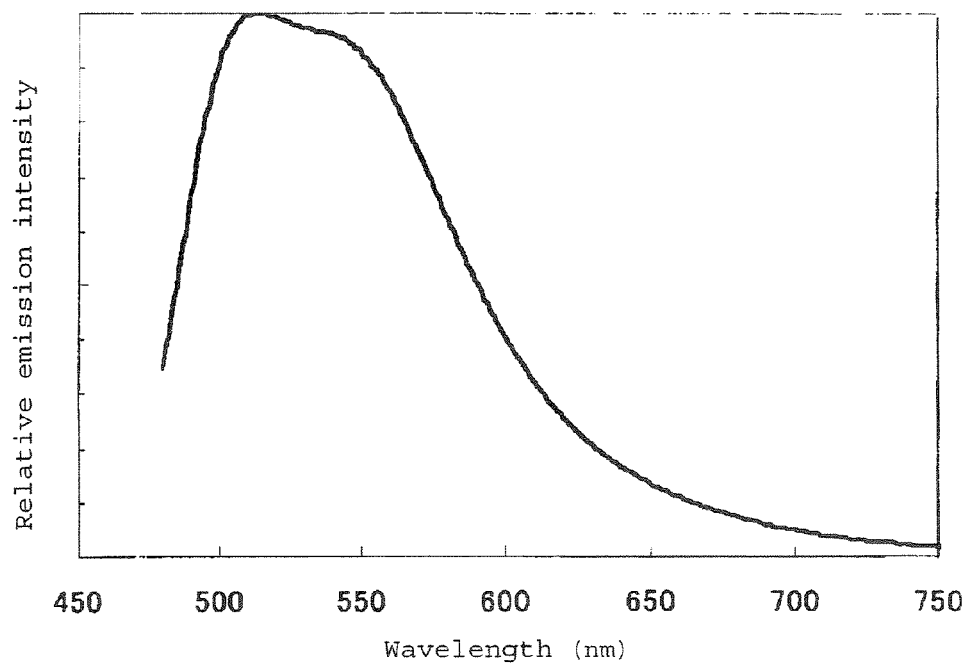
FIG. 21 is the emission spectrum of the phosphor obtained in Example 19 (provided that the vicinity of the excitation light wavelength (455 nm) is omitted).
Figure 22:
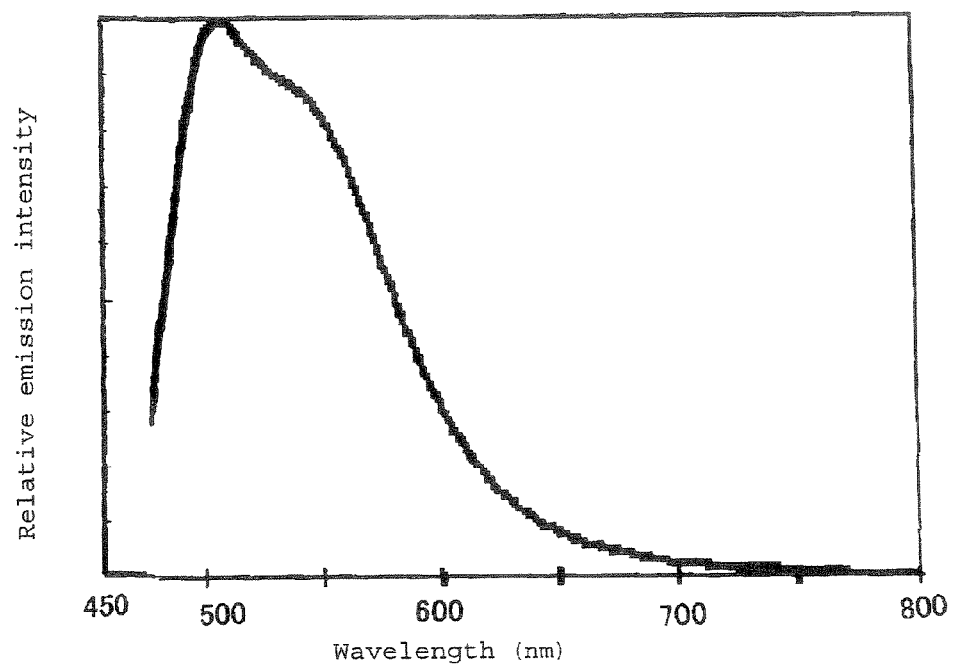
FIG. 22 is the emission spectrum of the phosphor obtained in Example 20 (provided that the vicinity of the excitation light wavelength (455 nm) is omitted).
Figure 23:
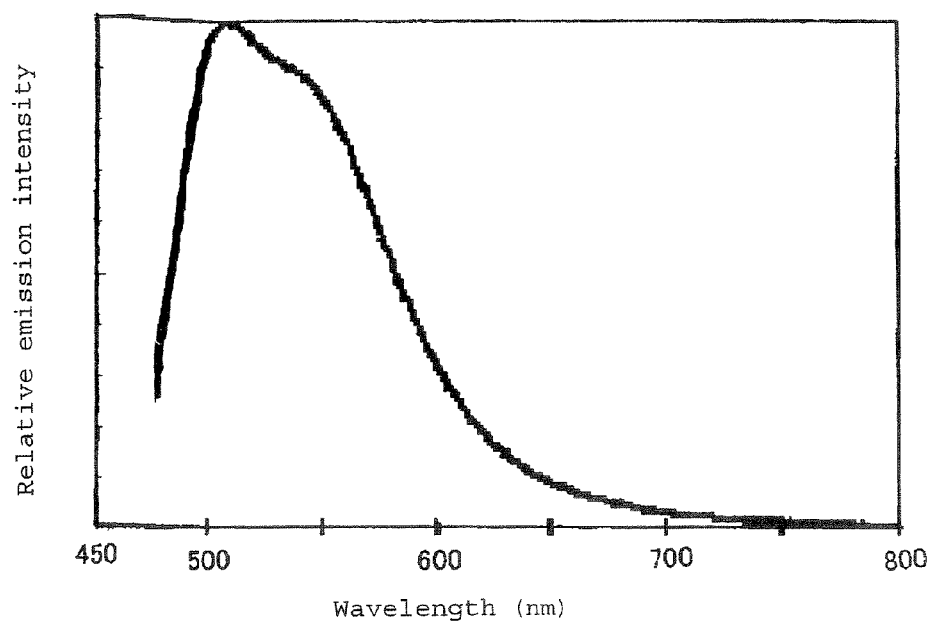
FIG. 23 is the emission spectrum of the phosphor obtained in Example 21 (provided that the vicinity of the excitation light wavelength (455 nm) is omitted).
Figure 24:
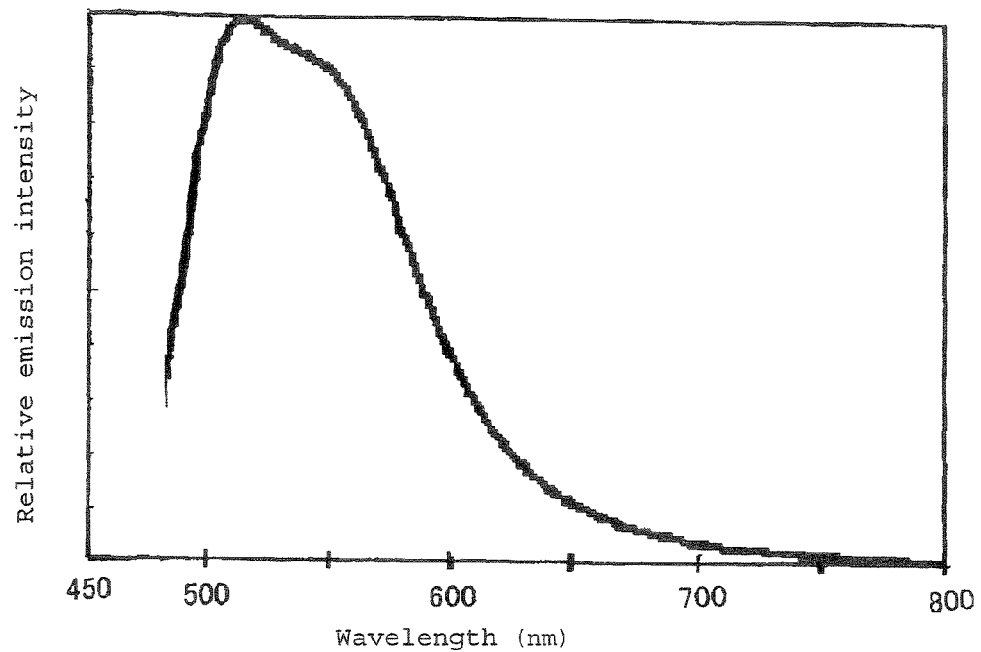
FIG. 24 is the emission spectrum of the phosphor obtained in Example 22 (provided that the vicinity of the excitation light wavelength (455 nm) is omitted).

Then, the emission spectrum of this phosphor was measured by the following method, and the results are shown in FIG. 20. Further, the peak wavelength is shown in Table 6.

Measurement of Emission Spectrum

In a fluorescence measuring apparatus (manufactured by JASCO Corporation), a 150 W xenon lamp was employed as an excitation light source. The light of the xenon lamp was passed through a 10 cm diffraction grating spectroscope, and only a light having a wavelength of 455 nm was applied to the phosphor through an optical fiber. The light generated by irradiation with the excitation light was spectrally divided by a 25 cm diffraction grating spectroscope, and emission intensities at various wavelengths of from 300 nm to 800 nm were measured by a multichannel CCD detector ("C7041", manufactured by Hamamatsu Photonics K.K.). Then, via signal treatment such as sensitivity correction by a personal computer, an emission spectrum was obtained.

Further, from the data in the wavelength region of from 480 nm to 800 nm of this emission spectrum, the color coordinates x and y in the XYZ color system as stipulated in JIS Z8701, were calculated, and the results are shown in Table 6. Further, from stimulus value Y in the XYZ color system calculated in accordance with JIS Z8724, the relative luminance was calculated on the basis that the value of stimulus value Y of the phosphor obtained in Comparative Example 9 given hereinafter, is taken as 100%, and the result is shown in Table 6. Further, the relative emission peak intensity was calculated on the basis that the emission peak intensity of the phosphor obtained in Comparative Example 9 was taken as 100%, and the result is shown in Table 6.

Comparative Example 9

Figure 32:
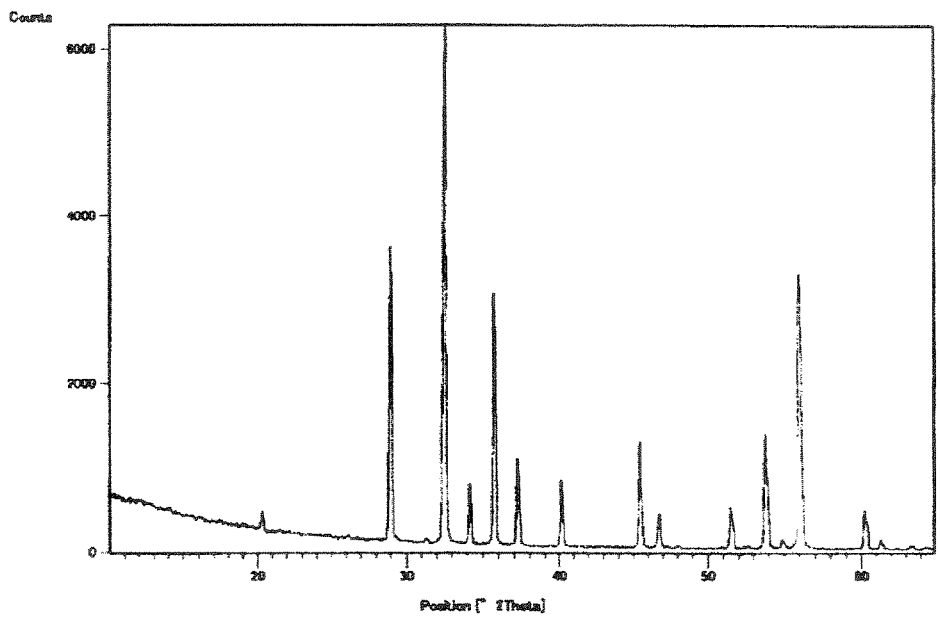
FIG. 32 is the powder X-ray diffraction pattern of the phosphor obtained in Comparative Example 9.

A phosphor was prepared in the same manner as in Example 18 except that the raw materials for the preparation of the phosphor were changed to 0.0297 mol of $CaCO_3$ as a $M^{21}$ source compound, 0.01 mol of $Sc_2O_3$ as a $M^{31}$ source compound, 0.03 mol of $SiO_2$ as a $M^{41}$ source compound and 0.0003 mol of $Ce(NO_3)_3$ (aqueous solution) as an $X^1$ source compound, and evaluated in the same manner, and the results are shown in Tables 5 and 6 and FIG. 32.

Examples 19 to 22

A phosphor was prepared in the same manner as in Example 18 except that the raw materials for the preparation of the phosphor were used so that the phosphor composition would be as shown in Table 5, and evaluated in the same manner. The results are shown in Tables 5 and 6 and FIGS. 28 to 31. Further, the emission spectra of the phosphors obtained in Examples 19 to 22 are shown in FIGS. 21 to 24, respectively.

Figure 25:
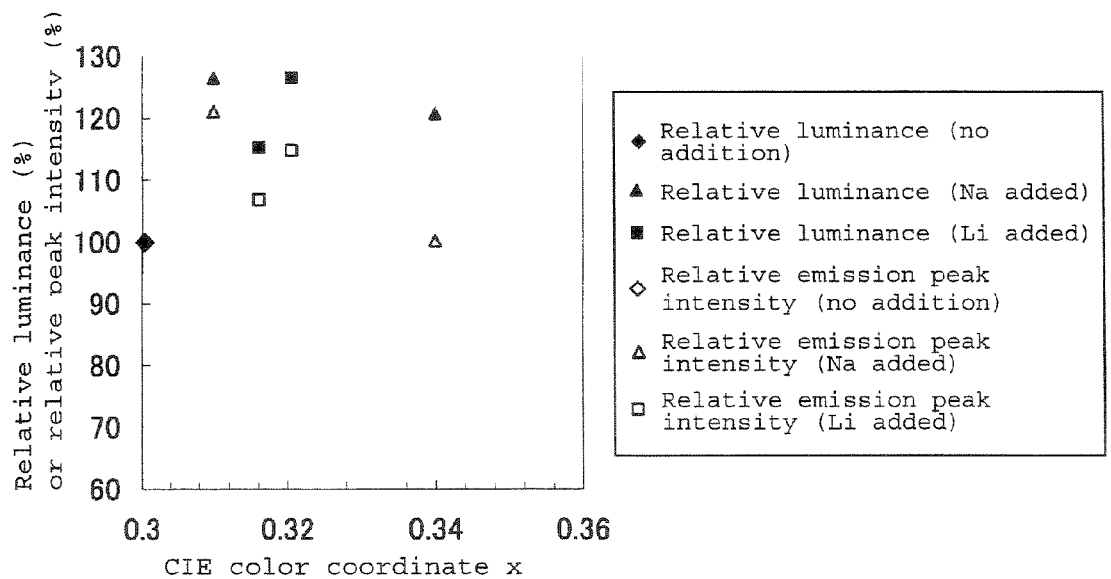
FIG. 25 is a graph showing the relation of the relative luminance and the relative emission peak intensity to the shift of the emission peak wavelength by an addition of Na or Li, from the data in Examples (the abscissa represents value x).

FIG. 25 is a graph simply showing from the data in Examples the relation of the relative luminance and the relative emission peak intensity by the addition of Na or Li. The abscissa represents value x of the CIE color coordinates, and the ordinate represents the relative emission peak intensity or the relative luminance. In FIG. 25, ♦ indicates the relative luminance in a case where no Li or Na was added, ▲ the relative luminance in a case where Na was added, ■ the relative luminance in a case where Li was added, ◇ the relative emission peak intensity in a case where no Li or Na was added, △ the relative emission peak intensity in a case where Na was added, and □ the relative emission peak intensity in a case where Li was added. As the color coordinate value x was increased by the addition of Na or Li, i.e. as the emission peak shifted towards the long wavelength side, both the relative emission peak intensity and the relative luminance increased. However, the increase of the luminance was larger than the increase of the relative emission peak intensity. This is considered attributable to the fact that the overlapping of the standard luminosity curve and the emission spectrum increased, whereby improvement of the luminance became large as compared with the increase of the peak intensity.

Figure 26:
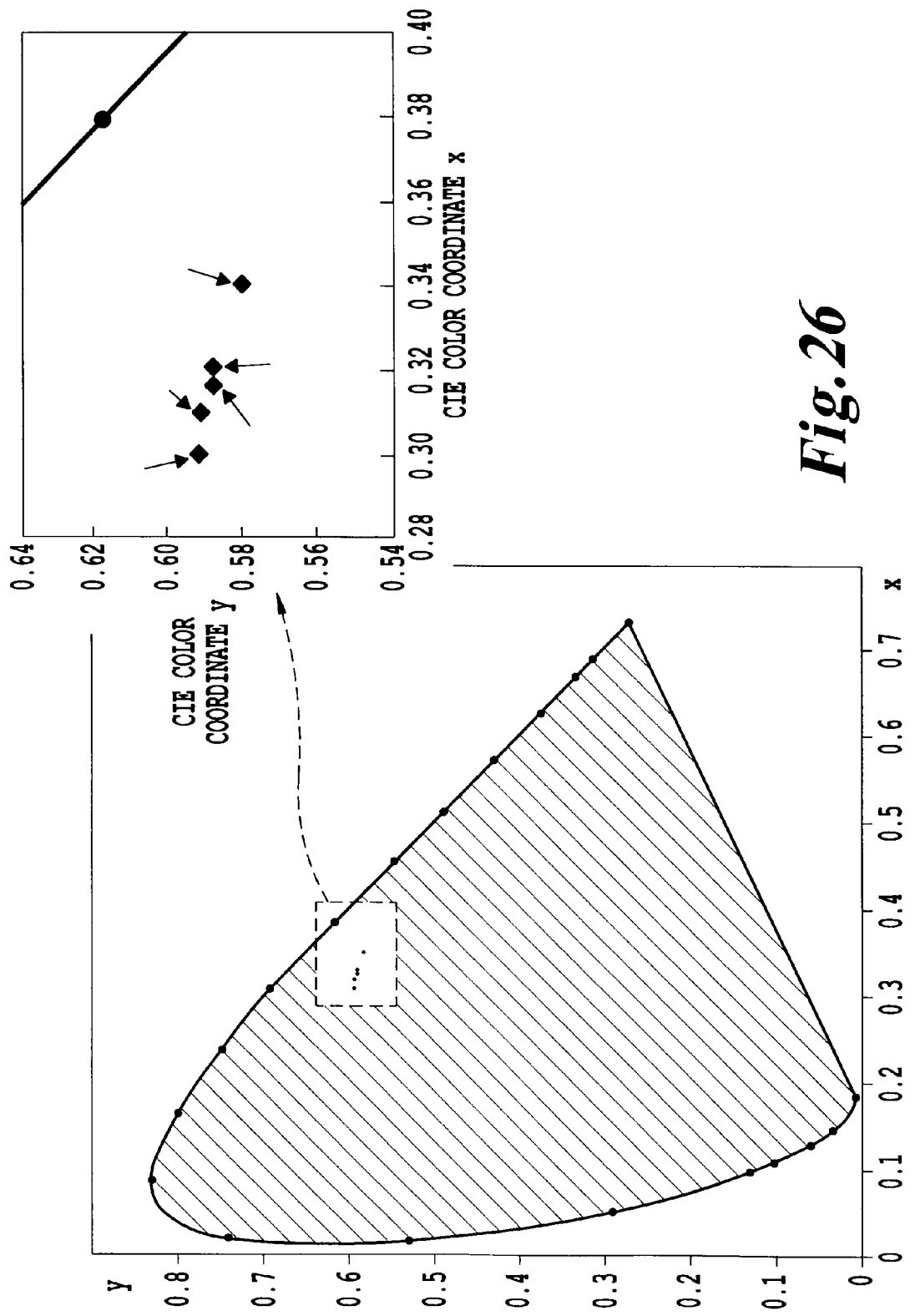
FIG. 26 is a graph having plotted all of the CIE color coordinates of the phosphors obtained in Examples 18 to 21 and Comparative Example 8.

FIG. 26 is a graph in which the CIE color coordinates in Examples 18 to 21 and Comparative Example 8 are all plotted. As shown in FIG. 26, they are plotted substantially on one line. It is evident that by the addition of Li or Na and the corresponding increase in the amount of Ce present in the crystal, x became large, y became small, and the emission color had reddish color increased

INDUSTRIAL APPLICABILITY

The phosphor of the present invention has high color rendering properties and is useful as a light-emitting device having high luminance. Particularly, it is useful as a wavelength-conversion material or a phosphor which absorbs light within a range of from ultraviolet light to visible light and emits visible light having a longer wavelength, in combination with e.g. a light-emitting diode or laser diode, for a light-emitting device, an image display device or a lighting system.

The entire disclosures of Japanese Patent Application No. 2004-301752 filed on Oct. 15, 2004, Japanese Patent Application No. 2005-030677 filed on Feb. 7, 2005 and Japanese Patent Application No. 2005-119986 filed on Apr. 18, 2005 including specifications, claims, drawings and summaries are incorporated herein by reference in their entireties.

TABLE 1

| | $M^1$ | | $M^2$ | | $M^3$ | | | | | Ce | $M^4$ |
|---|---|---|---|---|---|---|---|---|---|---|---|
| | Element | a | Element | b | Element 1 | Mols | Element 2 | Mols | c | d | Element |
| Ex. 1 | Mg | 0.06 | Ca | 2.97 | Sc | 1.94 | (Nil) | | 1.94 | 0.03 | Si |
| Comp. Ex. 1 | (Nil) | | Ca | 2.97 | Sc | 2 | (Nil) | | 2 | 0.03 | Si |
| Ex. 2 | Mg | 0.003 | Ca | 2.97 | Sc | 1.997 | (Nil) | | 1.997 | 0.03 | Si |
| Ex. 3 | Mg | 0.009 | Ca | 2.97 | Sc | 1.991 | (Nil) | | 1.991 | 0.03 | Si |
| Ex. 4 | Mg | 0.03 | Ca | 2.97 | Sc | 1.97 | (Nil) | | 1.97 | 0.03 | Si |
| Ex. 5 | Mg | 0.3 | Ca | 2.97 | Sc | 1.7 | (Nil) | | 1.7 | 0.03 | Si |
| Ex. 6 | Mg | 0.09 | Ca | 2.91 | Sc | 1.91 | (Nil) | | 1.91 | 0.09 | Si |
| Ex. 7 | Mg | 0.15 | Ca | 2.85 | Sc | 1.85 | (Nil) | | 1.85 | 0.15 | Si |
| Ex. 8 | Mg | 0.06 | Ca | 2.85 | Sc | 1.94 | (Nil) | | 1.94 | 0.15 | Si |
| Ex. 9 | Mg | 0.06 | Ca | 2.7 | Sc | 1.94 | (Nil) | | 1.94 | 0.3 | Si |
| Ex. 10 | Mg | 0.06 | Ca | 2.94 | Sc | 1.94 | (Nil) | | 1.94 | 0.06 | Si |
| Ex. 11 | Mg | 0.1 | Ca | 2.95 | Sc | 2 | (Nil) | | 2 | 0.06 | Si |
| Ex. 12 | Mg | 0.06 | Ca | 3.09 | Sc | 1.94 | (Nil) | | 1.94 | 0.06 | Si |
| Ex. 13 | Mg | 0.1 | Ca | 3.09 | Sc | 1.9 | (Nil) | | 1.9 | 0.06 | Si |
| Ex. 14 | Mg | 0.1 | Ca | 2.94 | Sc | 1.9 | (Nil) | | 1.9 | 0.06 | Si |
| Ex. 15 | Mg | 0.1 | Ca | 2.97 | Sc | 1.9 | (Nil) | | 1.9 | 0.3 | Si |

TABLE 1-continued

| | | | | | | | | | |
|---|---|---|---|---|---|---|---|---|---|
| Comp. Ex. 2 | Mg | 1 | Ca | 2.97 | Sc | 1 | (Nil) | 1 | 0.03 Si |
| Comp. Ex. 3 | Mg | 1.5 | Ca | 1.47 | Sc | 1.5 | Y | 0.5 | 2 0.03 Si |
| Comp. Ex. 4 | (Nil) | | Ca | 2.94 | Sc | 2 | (Nil) | | 2 0.06 Si |

| | | | | Emission characteristics | | |
|---|---|---|---|---|---|---|
| | O e | Temp. (° C.) | x | y | Relative luminance (%) | Relative peak intensity (%) | Peak wavelength (nm) |
| Ex. 1 | 11.985 | 1,400 | 0.34 | 0.58 | 120 | 103 | 513 |
| Comp. Ex. 1 | 12.015 | 1,500 | 0.30 | 0.59 | 100 | 100 | 507 |
| Ex. 2 | 12.0135 | 1,500 | 0.31 | 0.59 | 104 | 101 | 507 |
| Ex. 3 | 12.0105 | 1,500 | 0.31 | 0.59 | 103 | 100 | 509 |
| Ex. 4 | 12 | 1,400 | 0.33 | 0.59 | 116 | 104 | 510 |
| Ex. 5 | 11.865 | 1,400 | 0.35 | 0.58 | 107 | 88 | 516 |
| Ex. 6 | 12 | 1,400 | 0.37 | 0.57 | 115 | 90 | 545 |
| Ex. 7 | 12 | 1,400 | 0.39 | 0.55 | 106 | 83 | 553 |
| Ex. 8 | 12.045 | 1,400 | 0.37 | 0.57 | 109 | 86 | 544 |
| Ex. 9 | 12.12 | 1,400 | 0.37 | 0.57 | 118 | 93 | 545 |
| Ex. 10 | 12.01 | 1,420 | 0.34 | 0.58 | 111 | 93 | 513 |
| Ex. 11 | 12.14 | 1,420 | 0.35 | 0.58 | 124 | 102 | 515 |
| Ex. 12 | 12.15 | 1,420 | 0.33 | 0.59 | 130 | 105 | 510 |
| Ex. 13 | 12.13 | 1,420 | 0.34 | 0.58 | 123 | 104 | 514 |
| Ex. 14 | 11.98 | 1,450 | 0.35 | 0.58 | 115 | 93 | 514 |
| Ex. 15 | 12.37 | 1,450 | 0.37 | 0.57 | 106 | 82 | 547 |
| Comp. Ex. 2 | 11.515 | 1,400 | 0.38 | 0.56 | 78 | 60 | 549 |
| Comp. Ex. 3 | 11.265 | 1,400 | 0.44 | 0.53 | 62 | 47 | 562 |
| Comp. Ex. 4 | 12.03 | 1,450 | 0.30 | 0.59 | 99 | 99 | 508 |

TABLE 2

| | Analytical values of composition | | | | |
|---|---|---|---|---|---|
| | Mg | Ca | Sc | Ce | Si |
| Comp. Ex. 4 | 0 | 2.91 | 2.21 | 0.009 | 3 |
| Ex. 14 | 0.055 | 2.92 | 2.16 | 0.028 | 3 |
| Ex. 15 | 0.074 | 2.86 | 2.12 | 0.049 | 3 |

Relative values based on Si = 3, are shown.

TABLE 3

| | Ex. 16 | Comp. Ex. 5 | Comp. Ex. 6 |
|---|---|---|---|
| Ra | 88 | 94 | 83 |
| R1 | 93 | 97 | 82 |
| R2 | 90 | 96 | 91 |
| R3 | 88 | 97 | 91 |
| R4 | 83 | 90 | 77 |
| R5 | 91 | 95 | 80 |
| R6 | 90 | 97 | 82 |
| R7 | 84 | 91 | 86 |
| R8 | 87 | 90 | 70 |
| R9 | 75 | 78 | 22 |
| R10 | 78 | 91 | 73 |
| R11 | 89 | 95 | 71 |
| R12 | 72 | 71 | 56 |
| R13 | 91 | 95 | 85 |
| R14 | 94 | 98 | 95 |
| R15 | 87 | 90 | 82 |

TABLE 4-A

| | Phosphor composition (composition of raw material mixture) | Peak wavelength λ (nm) | Half value width W(½) (nm) | ¼ Height width W(¼) (nm) |
|---|---|---|---|---|
| Ex. 17 | $Ca_{2.7}Ce_{0.3}Sc_{1.7}Mg_{0.3}Si_3O_{12}$ | 562 | 127 | 190 |
| Comp. Ex. 7 | $(Y_{0.7}Gd_{0.26}Ce_{0.04})_3Al_5O_{12}$ | 557 | 118 | 162 |
| Comp. Ex. 8 | $Ca_{1.47}Ce_{0.03}Mg_{1.5}Sc_{1.5}Y_{0.5}Si_3O_{12.015}$ | 562 | 121 | 178 |

TABLE 4-A-continued

|  | x | y | Relative luminance | Λ/4-18 | Λ/2-100 |
|---|---|---|---|---|---|
| Ex. 17 | 0.446 | 0.524 | 102 | 122.5 | 181 |
| Comp. Ex. 7 | 0.447 | 0.531 | 100 | 121.25 | 178.5 |
| Comp. Ex. 8 | 0.445 | 0.527 | 65 | 122.5 | 181 |

TABLE 4-B

| | Phosphor composition (composition of raw material mixture) | x | y | Ra | Total luminous flux (lm) |
|---|---|---|---|---|---|
| Ex. 17 | $Ca_{2.7}Ce_{0.3}Sc_{1.7}Mg_{0.3}Si_3O_{12}$ | 0.327 | 0.332 | 84 | 1.75 |
| Comp. Ex. 7 | $(Y_{0.7}Gd_{0.26}Ce_{0.04})_3Al_5O_{12}$ | 0.330 | 0.319 | 81 | 1.72 |

TABLE 5

| | Compositional ratio of charge (molar ratio) | | | | | | |
|---|---|---|---|---|---|---|---|
| | $Na_2CO_3$ | $Li_2CO_3$ | $CaCO_3$ | $MgCO_3$ *1 | $Ce(NO_3)_3$ | $Sc_2O_3$ | $SiO_2$ |
| Ex. 18 | 0.05 | 0 | 2.95 | 0 | 0.05 | 1 | 3 |
| Ex. 19 | 0.3 | 0 | 2.7 | 0 | 0.3 | 1 | 3 |
| Ex. 20 | 0 | 0.1 | 2.9 | 0 | 0.1 | 1 | 3 |
| Ex. 21 | 0 | 0.3 | 2.7 | 0 | 0.3 | 1 | 3 |
| Ex. 22 | 0.2 | 0 | 2.8 | 0.06 | 0.2 | 0.97 | 3 |
| Comp. Ex. 9 | 0 | 0 | 2.97 | 0 | 0.03 | 1 | 3 |

| | Compositional ratio of phosphor (molar ratio: measured value) *2 | | | | | | |
|---|---|---|---|---|---|---|---|
| | Na | Li | Ca | Mg | Ce | Sc | Si |
| Ex. 18 | 0.013 | 0 | 2.84 | 0 | 0.013 | 2.09 | 3 |
| Ex. 19 | 0.079 | 0 | 2.95 | 0 | 0.051 | 2.31 | 3 |
| Ex. 20 | 0 | 0.015 | 2.91 | 0 | 0.019 | 2.15 | 3 |
| Ex. 21 | 0 | 0.019 | 2.92 | 0 | 0.033 | 2.36 | 3 |
| Ex. 22 | 0.043 | 0 | 2.91 | 0.034 | 0.043 | 2.11 | 3 |
| Comp. Ex. 9 | 0 | 0 | 2.91 | 0 | 0.009 | 2.21 | 3 |

*1: As $MgCO_3$, basic magnesium-carbonate was used. The amount given is a molar ratio as Mg.
*2: The compositional ratio of the phosphor represents a relative value based on Si = 3. The analytical value of Sc includes the amount of Sc in scandium oxide co-existent with the phosphor, as a byproduct without being reacted during firing by heating.

TABLE 6

| | Emission characteristics | | | |
|---|---|---|---|---|
| | Peak wavelength (nm) | x | y | Relative luminance |
| Ex. 18 | 507 | 0.310 | 0.591 | 127 |
| Ex. 19 | 513 | 0.340 | 0.580 | 121 |
| Ex. 20 | 508 | 0.316 | 0.587 | 115 |
| Ex. 21 | 509 | 0.320 | 0.587 | 127 |
| Ex. 22 | 517 | 0.354 | 0.574 | 117 |
| Comp. Ex. 9 | 505 | 0.300 | 0.591 | 100 |

The invention claimed is:

1. A phosphor made of a compound represented by the following formula (II), which comprises, as a matrix, a compound of a garnet structure and which contains, as a luminescent center ion, a metal element in the matrix:

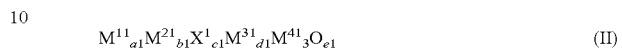

$$M^{11}{}_{a1}M^{21}{}_{b1}X^1{}_{c1}M^{31}{}_{d1}M^{41}{}_3O_{e1} \quad (II)$$

wherein $M^{11}$ is Na and/or Li, $M^{21}$ is a bivalent metal element, $X^1$ is a metal element as a luminescent center ion composed mainly of Ce, $M^{31}$ is a trivalent metal element excluding $X^1$, $M^{41}$ is a tetravalent metal element, and a1, b1, c1, d1 and e1 are numbers satisfying the following formulae, respectively:

$$0.001 < a1 < 0.5$$

$$2.5 < b1 < 3.3$$

$$0.005 < c1 < 0.5$$

$$1.5 < d1 < 2.5$$

$$e1 = \{(a1+b1) \times 2 + (c1+d1) \times 3 + 12\}/2.$$

2. The phosphor according to claim 1, wherein in the formula (II), $0.001 < a1 < 0.3$.

3. The phosphor according to claim 1, wherein in the formula (II), $0.02 < c1 < 0.1$.

4. The phosphor according to claim 1, wherein in the formula (II), $M^{21}$ is at least one bivalent metal element selected from the group consisting of Mg, Ca, Sr, Ba and Zn.

5. The phosphor according to claim 1, wherein in the formula (II), $M^{31}$ is at least one trivalent metal element selected from the group consisting of Al, Sc, Ga, Y, In, La, Gd and Lu.

6. The phosphor according to claim 1, wherein in the formula (II), $M^{41}$ is at least one tetravalent metal element selected from the group consisting of Si, Ti, Ge, Zr, Sn and Hf.

7. The phosphor according to claim 1, wherein in the formula (II), metal element $X^1$ as a luminescent center ion is Ce and at least one metal element selected from the group consisting of Mn, Fe, Pr, Nd, Sm, Eu, Gd, Tb and Tm.

8. The phosphor according to claim 1, wherein in the formula (II), $M^{11}$ is Na.

9. The phosphor according to claim 1, wherein in the formula (II), $X^1$ is Ce.

10. The phosphor according to claim 1, wherein in the formula (II), $X^1$ is Ce, $M^{11}$ is Na, $M^{21}$ is Ca, $M^{31}$ is Sc, and $M^{41}$ is Si.

* * * * *

UNITED STATES PATENT AND TRADEMARK OFFICE
CERTIFICATE OF CORRECTION

PATENT NO. : 7,713,441 B2 Page 1 of 1
APPLICATION NO. : 11/577016
DATED : May 11, 2010
INVENTOR(S) : Shimomura et al.

It is certified that error appears in the above-identified patent and that said Letters Patent is hereby corrected as shown below:

On the title page, Item (30), the Foreign Application Priority Data is incorrect. Item (30) should read:

-- (30)   Foreign Application Priority Data

Oct. 15, 2004   (JP) ................................ 2004-301752
Feb. 7, 2005    (JP) ................................ 2005-030677
Apr. 18, 2005   (JP) ................................ 2005-119986 --

Signed and Sealed this

Third Day of August, 2010

David J. Kappos
*Director of the United States Patent and Trademark Office*